United States Patent
Nagakari et al.

(10) Patent No.: US 6,573,584 B1
(45) Date of Patent: Jun. 3, 2003

(54) THIN FILM ELECTRONIC DEVICE AND CIRCUIT BOARD MOUNTING THE SAME

(75) Inventors: Shoken Nagakari, Kokubu (JP); Shunichi Kuwa, Kokubu (JP); Shigeo Kounushi, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/698,523

(22) Filed: Oct. 27, 2000

(30) Foreign Application Priority Data

| Oct. 29, 1999 | (JP) | 11-308362 |
| Dec. 24, 1999 | (JP) | 11-366682 |
| Dec. 24, 1999 | (JP) | 11-366684 |
| Jan. 31, 2000 | (JP) | 2000-027384 |
| Jan. 31, 2000 | (JP) | 2000-027386 |
| Mar. 29, 2000 | (JP) | 2000-092473 |
| Mar. 31, 2000 | (JP) | 2000-096540 |

(51) Int. Cl.$^7$ .................................................. H01L 29/00
(52) U.S. Cl. .................. 257/528; 257/532; 257/758; 257/773; 257/774; 257/784; 361/303; 361/306.1; 361/304; 361/305; 361/309
(58) Field of Search .................. 257/528, 532, 257/758, 773, 774, 784; 361/303, 306.1, 304, 305, 309

(56) References Cited

U.S. PATENT DOCUMENTS

| 5,900,643 | A | * | 5/1999 | Preslar et al. | 257/48 |
| 6,104,597 | A | * | 8/2000 | Konushi et al. | 361/301.4 |
| 6,166,424 | A | * | 12/2000 | Mikawa et al. | 257/535 |
| 6,178,082 | B1 | * | 1/2001 | Farooq et al. | 361/303 |
| 6,208,500 | B1 | * | 3/2001 | Alexander et al. | 361/303 |
| 6,226,171 | B1 | * | 5/2001 | Beilin et al. | 361/306.3 |
| 6,278,153 | B1 | * | 8/2001 | Kikuchi et al. | 257/310 |
| 6,282,079 | B1 | * | 8/2001 | Nagakari et al. | 361/303 |

FOREIGN PATENT DOCUMENTS

| EP | 1022 769 | * | 7/2000 |
| JP | 64 65815 | * | 3/1989 |
| JP | 2-281650 | * | 11/1990 |
| JP | 7-57967 | * | 3/1995 |
| JP | 9-191087 | * | 7/1997 |
| JP | 11-26290 | * | 1/1999 |
| JP | 11-111561 | * | 4/1999 |

* cited by examiner

Primary Examiner—Nathan J. Flynn
Assistant Examiner—Ahmed N. Sefer
(74) Attorney, Agent, or Firm—Hogan & Hartson, LLP

(57) ABSTRACT

The present invention provides a thin film capacitor which comprises: a carrier substrate; a thin film element provided on the carrier substrate and having an insulating layer and a plurality of electrode layers, the thin film element including areas formed with no insulating layer; and a plurality of external terminals electrically connected to the corresponding electrode layers for receiving electrical signals of different potentials applied thereto, the plurality of external terminals being respectively provided in the areas formed with no insulating layer and bonded to the carrier substrate via the electrode layers connected thereto. The thin film capacitor according to the invention features a sufficient insulating property and a higher break down voltage.

13 Claims, 10 Drawing Sheets

THIN FILM ELECTRONIC DEVICE AND CIRCUIT BOARD MOUNTING THE SAME

This application is based on Japanese Patent Applications No. 11-308362, No. 11-366682, No. 11-366684, No. 2000-027384, No. 2000-027386, No. 2000-092473 and No. 2000-096540, the contents of which are incorporated herein by reference.

BACKGROUND OF THE INVENTION

1. Field of the Invention

The present invention relates to a thin film electronic device and a circuit board mounted with the same. More particularly, the invention relates to a thin film electronic device serving as a thin film capacitor, a thin film inductor, a thin film filter or the like for high-frequency applications, and to a circuit board mounted with the thin film electronic device.

2. Description of Prior Art

With a recent trend toward size reduction and performance enhancement of electronic systems, electronic components to be provided in such electronic systems have increasingly been demanded to have a smaller size, a thinner thickness and an improved performance for high-frequency applications. Particularly in the case of high-speed digital circuits for computers, even for personal computers, which are required to process a greater amount of information at a higher speed, the processing speeds have been increased with a clock frequency (operating) of 200 MHz to 1 GHz in CPU chips and a clock frequency of 75 MHz to 133 MHz on inter-chip buses.

In the case of LSIs, a source voltage is generally reduced for reduction of power consumption, as the integration degree is increased with a greater number of elements integrated in a chip. For circuits having a higher operating speed, a higher integration density and a lower operating voltage, it is essential that a passive element such as a capacitor has a smaller size and a greater capacity and exhibit excellent characteristics for high-frequency or high-speed pulses.

As the operating frequency of a logic circuit is increased, the resistance and inductance of an element tend to cause an instantaneous source voltage drop and an additional voltage noise in the logic circuit. This may result in an error on the logic circuit. An instantaneous source voltage drop occurring when logic circuits are simultaneously switched, for example, can be suppressed by instantaneous supply of energy accumulated in a capacitor. The capacitor to be used for this purpose is called "decoupling capacitor". The decoupling capacitor should be capable of supplying a current as soon as possible in response to current fluctuations occurring faster than the clock frequency in a loaded portion. Therefore, the decoupling capacitor should assuredly be operative in a frequency range between 100 MHz and 1 GHz. For this reason, a consideration has been given to the electrode structure of the capacitor for reduction in the impedance of the capacitor attributable to the inductance of a capacitor element which is liable to increase with the frequency.

Severer requirements are imposed not only on the electrical characteristics of the passive element per se but also on mounting characteristics (mounting accuracy and mounting reliability), for example, for improvement of mounting accuracy with a greater number of integrated elements and for improvement of reflow resistance in mounting a component.

For reduction in the inductance of contacts of a capacitor, U.S. Pat. No. 4,439,813 proposes a capacitor having a construction such that a via-hole is provided as extending through a dielectric layer, a top electrode layer and a protective layer for obtaining an electrical signal from a bottom electrode through the shortest distance and an external terminal of a solder bump is provided in the via-hole.

FIG. 1 illustrates the capacitor disclosed in this publication. A bottom electrode layer 33, an insulating layer 35, a top electrode layer 37 and a protective layer 39 are sequentially stacked on a carrier substrate 31. An external terminal 42 is connected to the bottom electrode layer 33 through a via-hole formed in the protective layer 39, and an external terminal 44 is connected to the top electrode layer 37 through another via-hole formed in the protective layer 39. The external terminal 44 is formed on the insulating layer 35.

In this capacitor, the external terminal 44 connected to the top electrode layer 37 is formed on the insulating layer 35, so that an excessive stress is exerted on the insulating layer 35 due to shrinkage of a solder bump in a reflow process. As a result, cracks are liable to develop in the insulating layer 35, making it difficult to provide for reliable insulation.

The external terminal 44 connected to the top electrode layer 37 is bonded to the carrier substrate 31 via the top electrode layer 37, the insulating layer 35 and the bottom electrode layer 33. Therefore, the external terminal 44 has a smaller bonding strength with respect to the carrier substrate 31. Hence, the external terminal 44 is liable to be dislodged when some shock is given thereto.

U.S. Pat. No. 4,439,813 also proposes a capacitor having a construction such that a via-hole is provided as extending through a dielectric layer, a top electrode layer and a protective layer for obtaining an electrical signal from a bottom electrode through the shortest distance and an external terminal of a solder bump is provided on a laminate metallurgy layer of Cr/Cu/Au (hereinafter referred to as "BLM layer") formed on the interior surface of the via-hole.

FIG. 2 illustrates the proposed capacitor. A bottom electrode layer 33, an insulating layer 35, a top electrode layer 37 and a protective layer 39 are sequentially stacked on a carrier substrate 31. A via-hole 40 is formed in the protective layer 39, and a BLM layer 41 is provided on the interior surface of the via-hole 40. An external terminal 42 is connected to the BLM layer 41. An external terminal 44 is connected to the top electrode layer 37 through a via-hole 40 formed in the protective layer 39 and the BLM layer 41. The external terminal 44 is formed on the insulating layer 35.

The device reliability and mounting reliability of the capacitor are influenced by the thickness and covering property of the BLM layer 41 on which the external terminals 42, 44 are provided. In the capacitor of FIG. 2, a flat step 47 is provided around a vertically middle portion of the protective layer 39 on the interior surface of the via-hole 40 which accommodates the external terminal 42 connected to the bottom electrode layer 33. In the presence of the flat step 47, an edge 49 projects in the via-hole 40. Internal stresses in the BLM layer 41 are concentrated on the edge 49, so that cracks are liable to develop in the BLM layer 41. If the development of the cracks occurs, a solder may be diffused through the cracks, and the bonding strength between the interior surface of the via-hole 40 and the external terminal 42 maybe deteriorated. As a result, the device reliability and the mounting reliability may be reduced, i.e., the bottom face of the external terminal 42 may be separated from the electrode connected to the bottom face.

A conceivable approach to the prevention of the development of the cracks is to increase the thickness of the BLM layer 41. In this case, however, internal stresses in the BLM layer 41 are increased, presenting another problem of an adhesion failure such as separation of the BLM layer.

SUMMARY OF THE INVENTION

It is a principal object of the present invention to provide a thin film electronic device which features prevention of development of cracks in an insulating layer for reliable insulation.

It is another object of the invention to provide a thin film electronic device which features an improved bonding strength between external terminals and a carrier substrate.

It is further another object of the invention to provide a thin film electronic device which features a reduced inductance at contacts of external terminals and an improved bonding strength of the external terminals.

It is still another object of the invention to provide a circuit board mounted with any of the aforesaid thin film electronic devices.

In accordance with the present invention, there is provided a thin film electronic device which comprises: a carrier substrate; a laminate provided on the carrier substrate, and comprising a laminate structure having an insulating layer and a plurality of electrode layers, and a plurality of areas formed with no insulating layer; a thin film element formed in the laminate with the insulating layer held between the electrode layers; and a plurality of terminal electrodes electrically connected to the corresponding electrode layers and provided in the areas formed with no insulating layer for receiving electrical signals of different polarities applied thereto.

The foregoing and other objects, features and effects of the present invention will become more apparent from the following description of the preferred embodiments with reference to the attached drawings.

DESCRIPTION OF THE PREFERRED EMBODIMENTS

Figure 1:
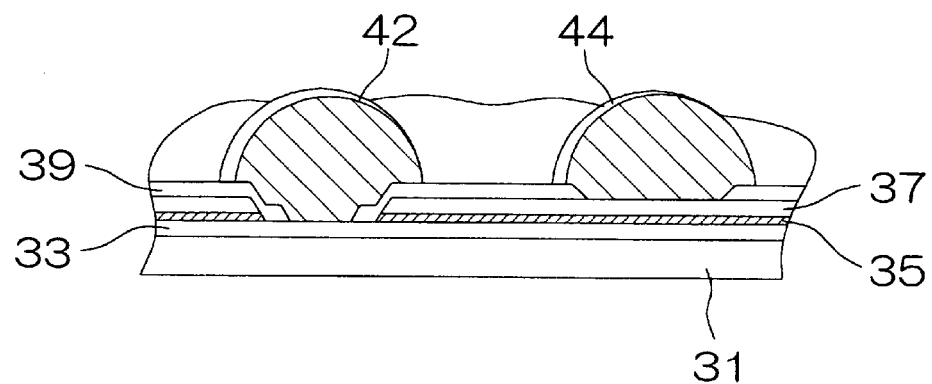
FIG. 1 is a sectional view illustrating the construction of a conventional thin film capacitor.
Figure 2:
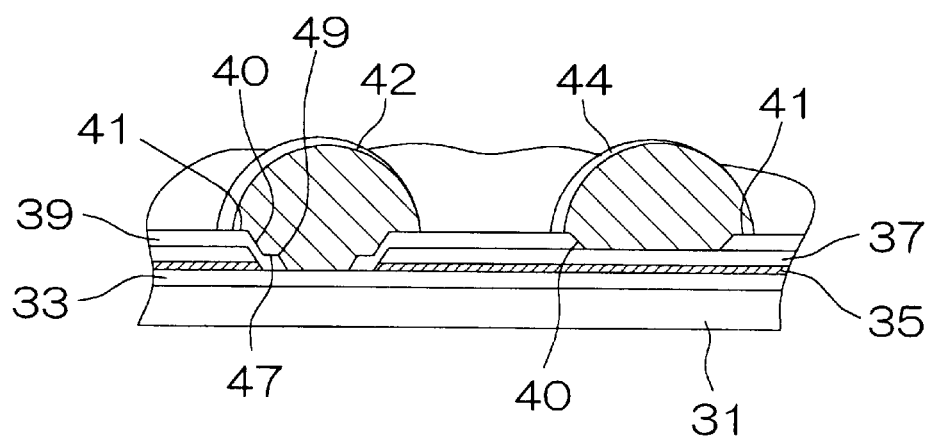
FIG. 2 is a sectional view illustrating the construction of another conventional thin film capacitor.
Figure 3:
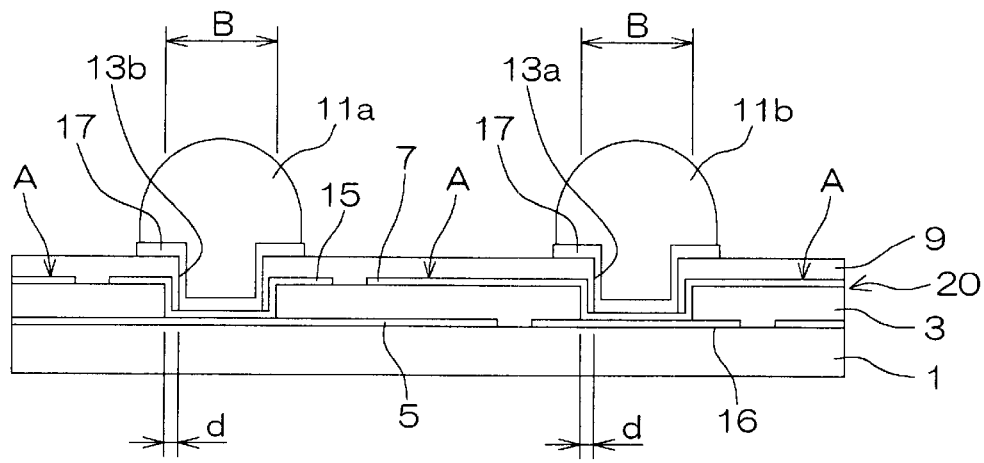
FIG. 3 is a sectional view illustrating the construction of a thin film capacitor according to a first embodiment of the present invention.
Figure 4:
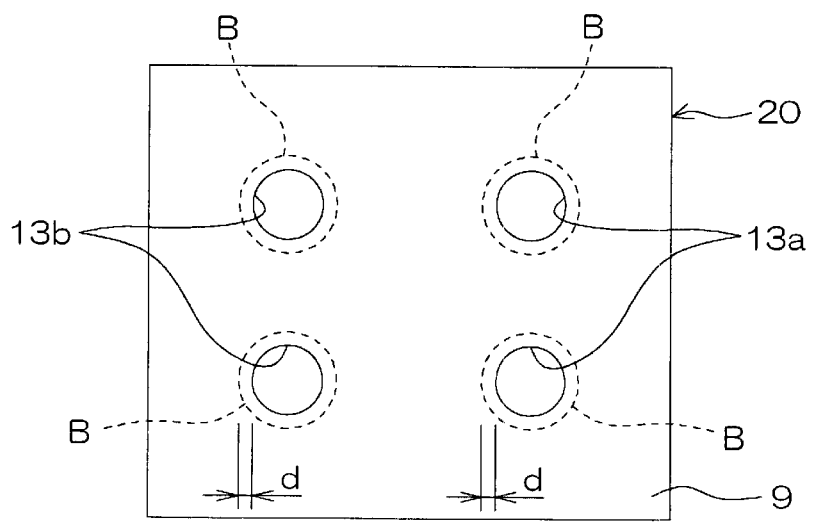
FIG. 4 is a plan view of the thin film capacitor according to the first embodiment of the invention with some elements being omitted.

FIGS. 3 and 4 illustrate a thin film capacitor according to a first embodiment of the present invention. Particularly, FIG. 3 is a sectional view, and FIG. 4 is a plan view. The thin film capacitor includes a laminate 20 having an insulating layer 3 and a plurality of electrode layers 5, 7 and provided on a carrier substrate 1. The laminate 20 includes a plurality of thin film elements A each constituted by the insulating layer (dielectric thin film) 3 and the electrode layers 5, 7. The electrode layers 5, 7 are composed of Au. The insulating layer 3 is held between the electrode layers 5 and 7 to constitute the thin film elements A (capacitor elements).

The insulating layer 3 is formed of a dielectric material of crystalline Perovskite oxide having a high relative permittivity in a high frequency range. Examples of the dielectric material include Pb (Mg, Nb) $O_3$ compounds, Pb(Mg, Nb)$O_3$—PbTiO$_3$ compounds, Pb(Zr, Ti)$O_3$ compounds, Pb(Mg, Nb)$O_3$—Pb(Zr, Ti)$O_3$ compounds, (Pb,La)ZrTiO$_3$ compounds, BaTiO$_3$ compounds and (Sr,Ba)TiO$_3$ compounds, materials obtained by adding an additive to any of these compounds, and compounds obtained by substitution of an element of any of these compounds.

The insulating layer 3 desirably has a thickness of 0.1 to 1.0 μm to provide for a high capacitance and a sufficient insulating property. If the thickness is smaller than 0.1 μm, the covering property is not sufficient, so that the insulating property may be deteriorated. If the thickness is greater than 1.0 μm, the capacitance tends to be reduced. The thickness of the insulating layer 3 is more desirably 0.15 to 0.8 μm.

The Au electrode layers 5, 7 desirably each have a thickness of 0.05 to 0.5 μm in consideration of the impedance in the high frequency range and the covering property of the layers. If the thickness of the electrode layer 5, 7 is smaller than 0.05 μm, perfect coverage with the electrode layers may be difficult.

Examples of a material for the carrier substrate 1 include alumina, sapphire, aluminum nitride, single crystalline MgO, single crystalline $SrTiO_3$, silicon with surface oxide, glass and quartz, but not limited thereto.

The laminate 20 is covered with a protective layer 9. External terminals 11a, 11b are provided on the protective layer 9 as projecting therefrom. The external terminals 11a are electrically connected to the lower electrode layer 5, while the external terminals 11b are electrically connected to the upper electrode layer 7. Electrical signals of different potentials are respectively applied to the external terminals 11a and 11b.

The protective layer 9 is composed, for example, of $Si_3N_4$, $SiO_2$, polyimide, BCB (benzocyclobutene) or the like.

The laminate 20 of the thin film capacitor includes areas B formed with no insulating layer. In the areas B formed with no insulating layer, through-holes 13a, 13b are formed in the protective layer 9. The upper electrode layer 7 is exposed in the bottom faces of the through-holes 13a. Metal layers 15 provided on the lower electrode layer 5 are exposed in the bottom faces of the through-holes 13b. Formation of the metal layers 15 is achieved by etching the upper electrode layer 7 annularly to surround the external terminals 11a for separation of the metal layers from the upper electrode layer 7.

Portions of the upper electrode layer 7 exposed in the bottom faces of the through-holes 13a are connected to the carrier substrate 1 via metal layers 16, and the lower electrode layer 5 is connected directly to the carrier substrate 1. Formation of the metal layers 16 is achieved by etching the lower electrode layer 5 annularly to surround the external terminals 11b for separation of the metal layers from the lower electrode layer 5.

At this time, a distance d between the side walls of the through-holes 13a, 13b and the associated side faces of the insulating layer 3 is desirably not smaller than 5 μm. From the viewpoint of the size of the device, it is suitable and particularly desirable that the distance (d) is 10 to 30 μm. If the distance d is smaller than 5 μm, the external terminals 11a, 11b are so close to the insulating layer 3 that the insulating layer 3 is susceptible to stresses occurring due to heat shrinkage of the external terminals 11a, 11b when the external terminals 11a, 11b are formed. The upper limit of the distance d is not particularly defined but, if the distance d is too great, the size of the device may be increased. Further, a distance between the external terminals 11a, 11b may be increased, thereby adversely affecting the electrical characteristics (inductance and the like).

Terminal electrode layers 17 are provided as covering interior surfaces of the through-holes 13a, 13b and upper surface portions of the protective layer 9 around the through-holes 13a, 13b, and the external terminals 11a and 11b are respectively provided in the through-holes 13b and 13a formed with the terminal electrode layers 17.

The bottom faces of the external terminals 11a are bonded to the carrier substrate 1 not via the insulating layer 3 but via the terminal electrode layers 17, the metal layers 15 and the lower electrode layer 5 in the areas B formed with no insulating layer. The bottom faces of the external terminals 11b are bonded to the carrier substrate 1 not via the insulating layer 3 but via the terminal electrode layers 17, the upper electrode layer 7 and the metal layers 16 in the areas B formed with no insulating layer.

The terminal electrode layers 17 are formed of Ti, Cr, Ni, Cu, Pd or Pt, or an alloy comprising two more metals selected from these metals. The formation of the terminal electrode layers 17 may be achieved by sputtering, vapor deposition, plating or the like. The terminal electrode layers 17 preferably have a thickness of not smaller than 0.1 μm.

The external terminals 11a, 11b, if constituted by solder bumps, are desirably formed of a material composed of at least two metals selected from Pb, Sn, Ag, In, Cu, Bi, Sb and Zn. The material for the external terminals 11a, 11b may be selected from various materials having different melting points and eutectic points, depending on the application of the thin film electronic device. The formation of the external terminals 11a, 11b is achieved by a known technique such as screen printing or a ball mounter.

Adherent layers having a good solder wettability are desirably provided between the external terminals 11a, 11b and the terminal electrode layers 17. Examples of a material having a good solder wettability include Ni—Cr and Au, and Au is particularly desirable. For improvement of adhesion of the terminal electrode layers 17 with respect to the Au electrode layer 7, the metal layers 15 and the protective layer 9, a known adherent material such as of Ti or Cr may intervene therebetween.

FIG. 4 is a plan view of the thin film capacitor with the external terminals 11a, 11b and the terminal electrode layers 17 being not shown, wherein the distance d between the side walls of the through-holes 13a, 13b and the associated side faces of the insulating layer 3 is shown.

Although bulged portions of the external terminals 11a, 11b are shown as slightly projecting out of the areas B formed with no insulating layer in FIG. 3, it is desirable, for reduction of the stresses occurring in the insulating layer 3 due to the heat shrinkage of the external terminals 11a, 11b, that the external terminals 11a, 11b do not project out of the areas B. Particularly, the external terminals 11a, 11b are desirably provided within the through-holes 13a, 13b as viewed in plan.

For use, the external terminals 11a, 11b of the thin film electronic device having the aforesaid construction are respectively connected to surface electrodes of a base (mother board).

In the thin film electronic device having the aforesaid construction, the external terminals 11a, 11b are provided in the areas B formed with no insulating layer, and the side faces of the insulating layer 3 are spaced by the distance d, particularly by a distance of not smaller than 5 μm, from the through-holes 13a, 13b in which the external terminals 11a, 11b are provided. Therefore, the insulating layer 3 is not directly damaged by the stresses occurring due to the heat shrinkage of the external terminals 11a, 11b in the reflow process and, hence, do not suffer from excessive stresses occurring therein. Thus, the development of cracks in the insulating layer 3 can be prevented, so that the insulating layer 3 can maintain a sufficient insulating property. As a result, the device characteristics as well as the mounting reliability can properly be maintained.

The external terminals 11a are bonded to the carrier substrate 1 via the metal components such as the terminal electrode layers 17, the metal layers 15 and the lower electrode layer 5. The external terminals 11b are also bonded to the carrier substrate 1 via the metal components such as the terminal electrode layers 17, the upper electrode layer 7 and the metal layers 16. Since the external terminals 11a, 11b are bonded to the carrier substrate 1 not via the insulating layer 3, the bonding strength of the external terminals 11a, 11b with respect to the carrier substrate 1 can be improved.

The electrode layers 5, 7 of the thin film elements A are formed of Au having a smaller resistance. Therefore, the electrode layers each have a reduced resistance in the high frequency range, so that the thin film elements A have excellent high-frequency characteristics. Since a Perovskite oxide having a higher specific permittivity can be used as the material for the insulating layer 3, the thin film capacitor has a higher capacitance with a reduced impedance.

Even with the Au electrode layers 5, 7, formation of alloy layers in interfaces between the external terminals 11a, 11b and the electrode layers 5, 7 can be prevented, because the external terminals 11a, 11b are electrically connected to the electrode layers 5, 7 via the terminal electrode layers 17. Thus, the adhesion strength between the external terminals 11a, 11b and the carrier substrate 1 can be improved. Further, a solder component can be prevented from being diffused through the Au electrode layers 5, 7 in the reflow process. Therefore, a short circuit between the electrode layers 5 and 7 and deterioration in the characteristics of the Au electrode layers 5, 7 can be suppressed, thereby improving the reflow resistance.

Further, the terminal electrode layers 17 are provided on the surface portions of the protective layer 9 around the through-holes 13a, 13b as projecting out of the through-holes 13a, 13b. Even if the reflow process is repeatedly performed, the metal element composing the external terminals is less liable to be diffused into the electrode layers 5, 7. Therefore, reduction in the adhesion strength of the external terminals 11a, 11b can be suppressed for improvement of the mounting reliability. The thin film electronic device is mounted on a board with the external terminals 11a, 11b thereof respectively connected to surface electrodes of the board.

Although Au is employed as the material for the electrode layers 5, 7 in this embodiment, adherent layers such as of Ti or Cr may be interposed between the electrode layers 5, 7 and the carrier substrate 1 for improvement of the adhesion of the electrode layers with respect to the carrier substrate 1.

For the improvement of the adhesion of the electrode layers with respect to the carrier substrate 1, such a construction that the provision of the metal layers 16 electrically connected to the upper electrode layer 7 is obviated may be employed instead of the aforesaid construction.

Although the lower electrode layer 5 has a single-layer structure consisting of the Au layer in the foregoing embodiment, the lower electrode layer 5 may have a triple-layer structure. More specifically, the lower electrode layer 5 may be of a triple-layer structure consisting of a metal oxide layer provided on the carrier substrate 1, a metal layer provided on the metal oxide layer and an Au layer provided on the metal layer.

In the lower electrode layer 5, the intermediate metal layer is preferably composed of the same metal as that contained in the lower metal oxide layer, and particularly desirably composed of Ti or Cr because of its high reactivity with other metals and metal oxides. Alternatively, an alloy of Ti and/or Cr may be employed as the material for the intermediate metal layer.

The intermediate metal layer desirably has a thickness of not greater than 30 nm. If the thickness of the metal layer is greater than 30 nm, diffusion and oxidation of the metal phase are more liable to occur in a high temperature annealing process. Therefore, it is particularly desirable that the thickness of the metal layer is 1 to 20 nm for improvement in the crystallinity of the dielectric material.

The upper Au layer desirably has a thickness of 0.05 to 0.5 $\mu$m in consideration of the impedance in the high frequency range and the covering property of the layer. If the thickness of the Au layer is smaller than 0.05 $\mu$m, perfect coverage with the layer maybe difficult.

The foregoing embodiment is directed to the thin film capacitor, but the construction according to the embodiment may be applied to a thin film inductor, a thin film LC filter or a thin film composite device having the functions of the inductor and the LC filter.

The thin film capacitor is of a single stack type in which the single insulating layer is held between the electrode layers in this embodiment, but may be of a multiple stack type in which a plurality of insulating layers and a plurality of electrode layers are alternately stacked.

Next, an explanation will be given to Example 1 of the thin film capacitor according to the first embodiment.

EXAMPLE 1

The formation of the electrode layers 5, 7 and the terminal electrode layers 17 was achieved by a high-frequency magnetron sputtering method, and the formation of the insulating layer 3 was achieved by a sol-gel method.

A 3-nm thick adherent layer of Ti was formed on a carrier substrate 1 of alumina, and a 0.3-$\mu$m thick Au layer was formed on the upper surface of the adherent layer. Then, the adherent layer and the Au layer were patterned by the photolithography technique for formation of a lower electrode layer 5 and metal layers 16.

Subsequently, a $Pb(Mg_{1/3}Nb_{2/3})$ $O_3$—$PbTiO_3$—$PbZrO_3$ coating solution prepared by the sol-gel method was applied onto the resulting substrate by a spin-coating method, and dried. The resulting substrate was subjected to a heat treatment at 380° C., and then baked at 815° C. Thus, a 0.7-$\mu$m thick insulating layer 3 of $Pb(Mg_{1/3}Nb_{2/3})O_3$—$PbTiO_3$—$PbZrO_3$ was formed. Thereafter, through-holes were formed in the insulating layer 3 by the photolithography technique.

Subsequently, a 30-nm thick Ti layer was formed as an adherent layer on the resulting substrate, and a 0.3-$\mu$m thick Au layer was formed on the adherent layer. Then, the adherent layer and the Au layer were patterned by the photolithography technique for formation of an upper electrode layer 7 and metal layers 15.

Thereafter, a photo-sensitive BCB (benzocyclobutene) was applied onto the resulting substrate, and then exposed to light and developed. Thus, a protective layer 9 with through-holes each having a diameter of about 100 $\mu$m and a depth of 1 $\mu$m was formed to expose the Au electrode layer 7 and the Au metal layers 15.

In this manner, thin film capacitors were fabricated, wherein distances d between the side faces of the insulating layer and the side walls of the through-holes were 5 $\mu$m, 10 $\mu$m and 30 $\mu$m, respectively, and a pitch between the external terminals was 0.4 mm. Further, a thin film capacitor was fabricated, wherein the terminal electrodes were formed directly on the insulating layer 3.

A 1.5-µm thick terminal electrode layer 17 and a 0.1-µm thick Au adherent layer were successively formed on the protective layer 9 and the interior surfaces of the through-holes 13a, 13b by the vapor deposition, and then patterned into a diameter of 120 µm by the photolithography technique so that Au adherent layers were left on portions of the protective layer 9 exposed on the interior surfaces of the through-holes 13a, 13b and surface portions of the protective layer 9 around the through-holes 13a, 13b.

Finally, a eutectic solder paste consisting essentially of 63 wt % Pb and 37 wt % Sn was transferred onto the patterned terminal electrode layers by a screen printing method, and the resulting substrate was subjected to a reflow process for formation of solder bumps as external terminals 11a, 11b. Thus, the thin film capacitors were fabricated which had the construction shown in FIG. 3.

The thin film capacitors thus fabricated each had an effective electrode area of 1.4 mm$^2$ and a capacitance of about 40 nF at a frequency of 1 kHz.

For comparison of the thin film capacitors having different distances d between the side faces of the insulating layer and the side faces of the protective layer, the rates of occurrence of short circuits after the reflow process and after the repeated reflow process were determined. The results of the observation of the short circuits are shown in Table 1.

TABLE 1

| Sample No. | *1 | 2 | 3 | 4 |
|---|---|---|---|---|
| Distance d (µm) | — | 5 | 10 | 30 |
| Rate of occurrence of short circuits | | | | |
| Before formation of external terminals | 0/100 | 0/100 | 0/100 | 0/100 |
| After reflow process | 30/100 | 0/100 | 0/100 | 0/100 |
| After third reflow process | 70/100 | 0/100 | 0/100 | 0/100 |
| After 10th reflow process | 95/100 | 0/100 | 0/100 | 0/100 |

A symbol * indicates a sample which falls out of the scope of the first embodiment. That is, Sample No. 1 is the thin film capacitor in which the external terminals were directly formed on the insulating layer.

In the case of the thin film capacitors (Samples No. 2 to No. 4) according to Example 1, as shown in Table 1, the distance d between the side faces of the insulating layer and the side faces of the protective layer was not smaller than 5 µm and, therefore, the rates of the occurrence of short circuits before the formation of the external terminals, after the first reflow process and after the repeated reflow process were zero. In the case of the thin film capacitor (Sample No. 1) in which the distance d between the side faces of the insulating layer and the side walls of the through-holes was not greater than 0 µm, i.e., the terminal electrodes were formed directly on the insulating layer, the rate of the occurrence of short circuits was zero before the formation of the external terminals, but the rate of the occurrence of short circuits was relatively high after the first reflow process and increased by repeatedly performing the reflow process.

As a result of observation of a short-circuited portion, it was found that the cause of the short circuit was development of cracks in the insulating layer 3, which was supposedly attributable to heat shrinkage of the solder bumps in the reflow process.

Further, thin film capacitors were fabricated in substantially the same manner as described above, except that a solder consisting essentially of 95 wt % Pb and 5 wt % Sn, a solder consisting essentially of Sn and 3.5 wt % Ag and a solder consisting essentially of Sn, 3 wt % Ag and 0.7 wt % Cu were employed as the materials for the solder bumps, and evaluated in the same manner. Although different reflow temperatures were employed depending on the composition of the solder bumps, substantially the same results as in the case where the eutectic solder bumps were employed were obtained as for the deterioration in the adhesion strength and the reduction in the capacitance. Thus, the construction according to the first embodiment is very effective for the reflow resistance.

Next, an explanation will be given to Example 2 of the thin film capacitor according to the first embodiment.

EXAMPLE 2

The formation of the electrode layers 5, 7 and the terminal electrode layers 17 was achieved by a high-frequency magnetron sputtering method, and the formation of the dielectric thin film (insulating layer) 3 was achieved by a sol-gel method.

A 3-nm thick adherent layer of Ti was formed on a carrier substrate 1 of alumina, and a 0.3-µm thick Au layer was formed on the upper surface of the adherent layer. Then, the adherent layer and the Au layer were patterned by the photolithography technique for formation of a lower electrode layer 5 and metal layers 16. Subsequently, a Pb(Mg$_{1/3}$Nb$_{2/3}$)O$_3$—PbTiO$_3$—PbZrO$_3$ coating solution prepared by the sol-gel method was applied onto the resulting substrate by a spin-coating method, and dried. The resulting substrate was subjected to a heat treatment at 380° C., and then baked at 815° C. Thus, a 0.7-µm thick dielectric thin film 3 of Pb(Mg$_{1/3}$Nb$_{2/3}$)O$_3$—PbTiO$_3$—PbZrO$_3$ was formed. Thereafter, through-holes were formed in the dielectric thin film 3 by the photolithography technique.

Subsequently, a 30-nm thick adherent layer of Ti was formed on the upper surface of the dielectric thin film 3, and a 0.3-µm thick Au layer was formed on the adherent layer. Then, the adherent layer and the Au layer were patterned by the photolithography technique for formation of an upper electrode layer 7 and metal layers 15.

Thereafter, a photo-sensitive BCB was applied onto the resulting substrate, and then exposed to light and developed. Thus, a protective layer 9 with through-holes each having a diameter of about 100 µm and a depth of 1 µm was formed to expose the Au electrode layer 7 and the Au metal layers 15.

A 1.5-µm thick terminal electrode layer 17 and a 0.1-µm thick Au adherent layer were successively formed on the protective layer 9 and in the through-holes 13a, 13b by the vapor deposition, and patterned into a diameter of 120 µm by the photolithography technique so that terminal electrode layers 17 were left in and around the through-holes.

Finally, a eutectic solder paste consisting essentially of 63 wt % Pb and 37 wt % Sn was transferred onto the patterned terminal electrode layers 17 by a screen printing method, and the resulting substrate was subjected to a reflow process for formation of the external terminals 11a, 11b. Thus, the thin film capacitor was fabricated which had the construction shown in FIG. 3.

The thin film capacitor thus fabricated had an effective electrode area of 1.4 mm$^2$ and a capacitance of about 40 nF at a frequency of 1 kHz.

The thin film capacitor of Example 2 was checked for the reflow resistance. As a result, almost no solder diffusion was observed even after the reflow process was repeated ten times.

Further, the ball shear strength was measured after the repeated reflow process. As a result, the ball shear strength was reduced only by about 15% as compared with the initial ball shear strength even after the tenth reflow process. This indicates that the deterioration in the strength of the solder bamps was small.

Moreover, a relationship between the capacitance and the time of the repetition of the reflow process was investigated. The investigation indicates that almost no change was observed in the capacitance even after the tenth reflow process. Therefore, the thin film capacitor of Example 2 was free from the diffusion of the solder, and the dielectric thin film was hardly influenced by stresses caused due to heat shrinkage of the solder bumps thereby to provide for sufficient insulation.

Figure 5:
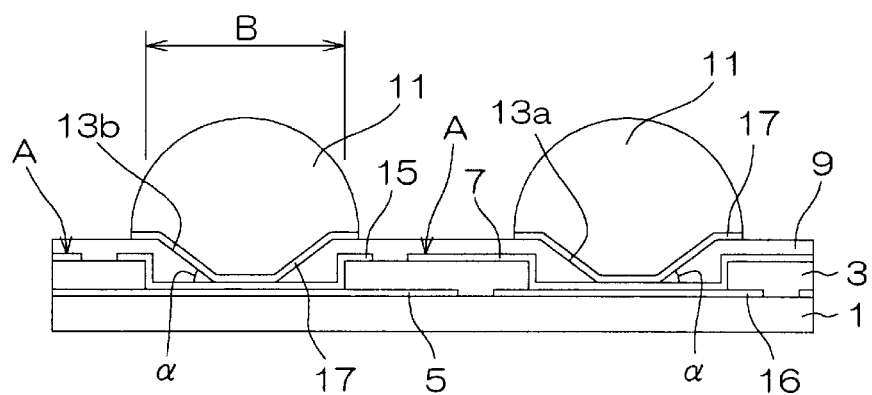
FIG. 5 is a sectional view illustrating the construction of a thin film capacitor according to a second embodiment of the invention.

FIG. 5 illustrates a thin film capacitor according to a second embodiment of the present invention. As shown in FIG. 5, the thin film capacitor comprises a plurality of thin film elements A each provided on a carrier substrate 1 and constituted by an insulating layer (dielectric thin film) 3 and electrode layers 5, 7. The electrode layers 5, 7 are composed of Au. The insulating layer 3 is held between the electrode layers 5 and 7 to constitute the thin film elements A (capacitor elements).

The material for and the thickness of the insulating layer 3, the thickness of each of the electrode layers 5, 7, and the material for the carrier substrate 1 are the same as those in the first embodiment.

Through-holes 13a, 13b provided in areas B formed with no insulating layer each have a diameter which is gradually increased toward the surface of a protective film 9 from the electrodes layers 5, 7. That is, the interior surfaces of the through-holes 13a, 13b are linearly inclined at a predetermined angle α with respect to the electrode layers 5, 7. The angle α between the interior surfaces of the through-holes 13a, 13b and the electrode layers 5, 7 is desirably 15 to 60 degrees. With the angle α being 15 to 60 degrees, sufficient coverage of the interior surfaces with terminal electrode layers formed thereon can be ensured even if the terminal electrode layers each have a smaller thickness. If the angle is greater than 60 degrees, the coverage of the interior surfaces with the terminal electrode layers is deteriorated. If the angle is smaller than 15 degrees, the coverage with the terminal electrode layers is improved, but it is difficult to increase the thickness of the protective film 9, thereby deteriorating the moisture resistance reliability.

The interior surfaces of the through-holes 13a, 13b and their peripheral surface portions are covered with the terminal electrode layers 17. External terminals 11 are respectively provided on the surfaces of the terminal electrode layers 17. Voltages of different polarities are applied to the external terminals 11.

The through-holes 13a, 13b in the protective film 9 are desirably of a circular shape, and have a diameter of 80 to 140 μm. Thus, a sufficient bonding strength can be provided between the external terminals 11 and the carrier substrate 1, so that the size of the external terminals 11 can be increased. If the diameter of the bottom face of the through-hole 13a, 13b is smaller than 80 μm, it is difficult to ensure a sufficient bonding strength with a single external terminal. Therefore, many external terminals are required for providing a sufficient bonding strength of the device. If the diameter of the bottom face of the through-hole 13a, 13b is greater than 140 μm, a significant increase in the device size may result, which is contradictory to the intention of the size reduction.

In the thin film capacitor having the aforesaid construction, the internal surfaces of the through-holes 13a, 13b are linearly inclined at the predetermined angle a with respect to the electrode layers 5, 7, so that no step project into the through-holes 13a, 13b as in the prior art. Therefore, the coverage of the interior surfaces of the through-holes with the terminal electrode layers 17 can be improved. Thus, the deterioration in the reflow resistance due to the diffusion through the interior surfaces can be suppressed. Further, the diffusion preventing effect can be provided even if the terminal electrode layers 17 each have a smaller thickness. Therefore, the internal stresses in the terminal electrode layers 17 can be reduced, so that the deterioration in the device reliability due to separation or lifting of the terminal electrode layers can be suppressed.

Since the coverage with the terminal electrode layers 17 can be improved, the bonding strength between the interior surfaces of the through-holes 13a, 13b and the external terminals 11 filled in the through-holes 13a, 13b can be improved. Therefore, the external terminals 11 filled in the through-holes 13a, 13b can be prevented from being separated from the electrode layers 5, 7 to which the bottom faces of the external terminals 11 are respectively bonded.

In this embodiment, the external terminals 11 are provided in the areas B formed with no insulating layer as in the first embodiment. Even if the external terminals 11 shrink in the reflow process, the insulating layer 3 is not directly damaged and, hence, development of cracks in the insulating layer 3 can be prevented. Thus, the device characteristics as well as the mounting reliability can properly be maintained.

The electrode layers 5, 7 of the thin film elements A are formed of Au having a smaller resistance. Therefore, the electrode layers each have a reduced resistance in a high frequency range, so that the thin film elements A have excellent high-frequency characteristics. Since a Perovskite oxide having a higher permittivity can be employed as the material for the insulating layer 3, the thin film capacitor has a higher capacitance with a reduced impedance.

Even with the electrode layers 5, 7 of Au, formation of alloy layers in interfaces between the external terminals and the electrode layers 5, 7 can be prevented, because the external terminals 11 are electrically connected to the electrode layers 5, 7 via the terminal electrode layers 17. Thus, deterioration in the adhesion strength between the external terminals 11 and the carrier substrate 1 can be suppressed. Further, the metal element composing the external terminals can be prevented from being diffused through the electrode layers of Au 5, 7 in the reflow process, so that the reflow resistance can be improved.

In this embodiment, adherent layers such as of Ti or Cr may be interposed between the electrode layers 5, 7 and the carrier substrate 1 for improvement of the adhesion between the electrode layers 5, 7 and the carrier substrate 1.

In the second embodiment, the lower electrode layer 5 may have a triple-layer structure as in the first embodiment.

Figure 6:
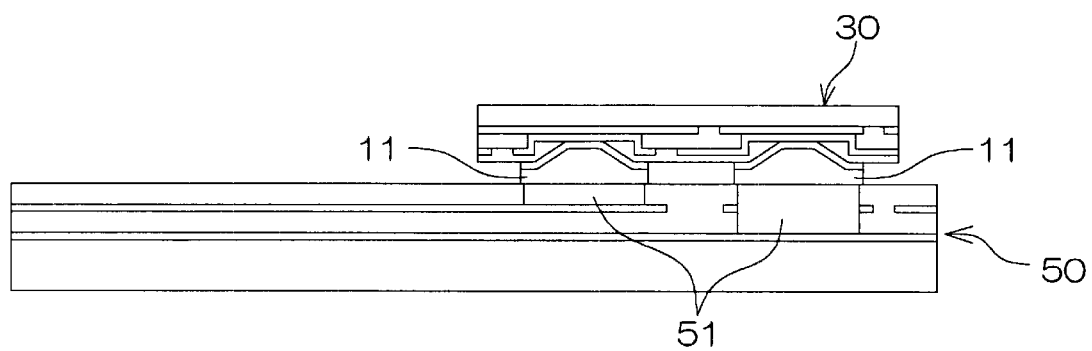
FIG. 6 is a sectional view illustrating the construction of an exemplary circuit board mounted with the thin film capacitor according to the second embodiment of the invention.

As shown in FIG. 6, an exemplary circuit board according to the invention is constructed such that the external terminals 11 of the thin film electronic device 30 having the aforesaid construction are respectively connected to electrodes 51 formed on a surface of a base 50 of an insulating material.

The construction according to the second embodiment is applicable not only to the thin film capacitor but also to a thin film inductor, a thin film LC filter and a thin film composite device having the functions of the inductor and the LC filter.

The thin film capacitor is of a single stack type in which the single insulating layer is held between the electrode layers in this embodiment, but may be of a multiple stack type in which a plurality of insulating layers and a plurality of electrode layers are alternately stacked.

Next, an explanation will be given to an example of the thin film capacitor according to the second embodiment.

The formation of the electrode layers 5, 7 and the terminal electrode layers 17 was achieved by a high-frequency magnetron sputtering method, and the formation of the insulating layer (dielectric thin film) 3 was achieved by a sol-gel method.

A 3-nm thick adherent layer of Ti was formed on a carrier substrate 1 of alumina, and a 0.3-$\mu$m thick Au layer was formed on the upper surface of the adherent layer. Then, the adherent layer and the Au layer were patterned by the photolithography technique for formation of a lower electrode layer 5 and metal layers 16.

Subsequently, a Pb(Mg$_{1/3}$Nb$_{2/3}$) O$_3$—PbTiO$_3$—PbZrO$_3$ coating solution prepared by the sol-gel method was applied onto the resulting substrate by a spin-coating method, and dried. The resulting substrate was subjected to a heat treatment at 380° C., and then baked at 815° C. Thus, a 0.7-$\mu$m thick insulating layer 3 of Pb(Mg$_{1/3}$Nb$_{2/3}$) O$_3$—PbTiO$_3$—PbZrO$_3$ was formed. Thereafter, through-holes were formed in the insulating layer 3 by the photolithography technique.

Subsequently, a 30-nm thick adherent layer of Ti was formed on the upper surface of the insulating layer 3, and a 0.3-$\mu$m thick Au layer was formed on the adherent layer. Then, the adherent layer and the Au layer were patterned by the photo lithography technique for formation of an upper electrode layer 7 and metal layers 15.

Thereafter, a photo-sensitive BCB was applied onto the resulting substrate, and then exposed to light and developed. Thus, a protective film 9 with through-holes each having a diameter of about 100 $\mu$m and a depth of 1 $\mu$m was formed to expose the Au electrode layer 7 and the Au metal layers 15.

At this time, various conditions were employed for the light exposure and development of the protective film 9 and the post baking, and different angles $\alpha$ were formed between the side walls of the through-holes and the electrode layers, as shown in Table 2.

A 0.5-$\mu$m thick terminal electrode layer 17 and a 0.1-$\mu$m thick Au adherent layer were successively formed on the protective layer 9 and in the through-holes 13a, 13b by the sputtering method, and patterned into a diameter of 120 $\mu$m centering on the through-holes 13a, 13b by the photolithography technique so that Au adherent layers were left on portions of the protective layer 9 exposed on the interior surfaces of the through-holes 13a, 13b and surface portions of the protective layer 9 around the through-holes 13a, 13b.

Finally, a eutectic solder paste consisting essentially of 63 wt % Pb and 37 wt % Sn was transferred onto the patterned terminal electrode layers by a screen printing method, and the resulting substrate was subjected to a reflow process for formation of solder bumps as external terminals 11. Thus, thin film capacitors were fabricated which had the construction shown in FIG. 5.

The thin film capacitors thus fabricated each had an effective electrode area of 1.4 mm$^2$ and a capacitance of about 40 nF at a frequency of 1 kHz.

For comparison of the thin film capacitors having different terminal constructions, the coverage of the interior surfaces with the terminal electrode layers 17 was checked, and the ball shear strength after a reflow resistance test was determined with the use of a shear strength tester every time the reflow process was performed. The results are shown in Table 2.

TABLE 2

| Sample No. | 1 | 2 | 3 | 4 | *5 |
|---|---|---|---|---|---|
| Angle $\alpha$ (degrees) | 15 | 30 | 45 | 60 | 90 |
| Thickness of terminal electrode layers on interior surfaces ($\mu$m) | 0.5 | 0.5 | 0.5 | 0.5 | 0.5 |
| Shear strength (N/bump) | | | | | |
| Initially | 0.882 | 0.876 | 0.884 | 0.886 | 0.441 |
| After 10th reflow process | 0.853 | 0.848 | 0.846 | 0.842 | 0.216 |

A symbol * indicates a sample which falls out of the scope of the second embodiment.

In the thin film capacitors according to this example, as shown in Table 2, the terminal electrode layers assuredly had a thickness of 0.5$\mu$m, and the shear strength measured after the tenth reflow process was reduced by about 5% as compared with the shear strength measured after the first reflow process. The external terminals 11 had a high bonding strength with respect to the electrode layers. Further, the thin film capacitors had an improved reflow resistance.

The thin film electronic device of Sample No. 5 was evaluated in the same manner as described above. Although the terminal electrode layers on the interior surfaces assuredly had a thickness of 0.5 $\mu$m, the shear strength after the tenth reflow process was reduced by 50% or more as compared with the shear strength after the first reflow process. Observation by means of a cross section SEM indicates that the solder was diffused through cracks developed in the dielectric layer below the external terminals adjacent to the upper electrode layer and through cracks developed in the steps of the BLM layers adjacent to the lower electrode layer.

In Table 2, the thickness of the terminal electrode layers was 0.5 $\mu$m but, when the angle $\alpha$ is 90 degrees, it is desirable to increase the thickness of the terminal electrode layers.

Further, thin film capacitors were fabricated in substantially the same manner as described above, except that a 95% Pb-5% Sn solder, an Sn-3.5% Ag solder and an Sn-3% Ag-0.7% Cu solder were employed as the materials for the solder bumps, and evaluated in the same manner. Although different reflow temperatures were employed depending on the composition of the solder bumps, substantially the same results as in the case where the eutectic solder bumps were employed were obtained as for the deterioration in the coverage and the adhesion strength. Thus, the construction according to this embodiment is very effective for the bonding strength of the external terminals 11 and the reflow resistance.

Figure 7:
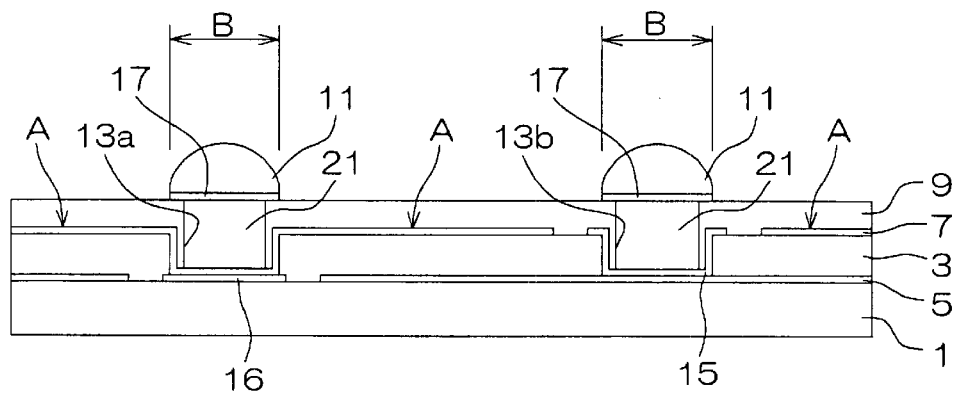
FIG. 7 is a sectional view illustrating the construction of a thin film capacitor according to a third embodiment of the invention.

FIG. 7 illustrates a thin film capacitor according to a third embodiment of the present invention. As shown in FIG. 7, the thin film capacitor comprises a plurality of thin film elements A each provided on a carrier substrate 1 and constituted by an insulating layer (dielectric thin film) 3 and electrode layers 5, 7. The electrode layers 5, 7 are composed of Au. The insulating layer 3 is held between the electrode layers 5 and 7 to constitute the thin film elements A (capacitor elements).

The thin film elements A and areas B formed with no insulating layer are covered with a protective layer 9, and external terminals 11 are provided on the protective layer 9 as projecting therefrom.

The materials for and the thicknesses of the insulating layer 3, the electrode layers 5, 7, the carrier substrate 1, the protective layer 9 and the external terminals 11 are the same as those in the first embodiment. As in the first embodiment, the electrode layer 5 may be of a triple layer structure.

Through-holes 13a, 13b are formed in the protective layer 9 in the areas B formed with no insulating layer. The upper electrode layer 7 is exposed in the bottom of the through-hole 13a, and a metal layer 15 mounted on the lower electrode layer 5 is exposed in the bottom of the through-hole 13b. The upper electrode layer 7 exposed in the bottom of the through-hole 13a is bonded to the carrier substrate 1 via a metal layer 16, while the lower electrode layer 5 is directly bonded to the carrier substrate 1.

The through-holes 13a, 13b are respectively filled with terminal electrodes 21. Terminal electrode layers 17 are provided as covering surfaces of the terminal electrodes 21 and surface portions of the protective layer 9 around the through-holes 13a, 13b in the areas B formed with no insulating layer, and the external terminals 11 are respectively provided on the terminal electrode layers 17.

The terminal electrode layers 17 preferably each have a thickness of not smaller than 0.1 $\mu$m. The terminal electrodes 21 and the terminal electrode layers 17 can be formed of the same material by the same method.

The material and formation method for the external terminals 11 are the same as in the first embodiment. It is desirable, as in the first embodiment, that adherent layers are provided between the external terminals 11 and the terminal electrode layers 17.

For use, the external terminals 11 of the thin film electronic device having the aforesaid construction are respectively connected to surface electrodes of a mother board.

The thin film electronic device having the aforesaid construction in accordance with the third embodiment provides the same effects as the thin film electronic device according to the first embodiment.

The construction according to the third embodiment is applicable not only to the thin film capacitor but also to a thin film inductor, a thin film LC filter and a thin film composite device having the functions of the inductor and the LC filter.

The thin film capacitor is of a single stack type in which the single insulating layer is held between the electrode layers in this embodiment, but may be of a multiple stack type in which a plurality of insulating layers and a plurality of electrode layers are alternately stacked.

Next, an explanation will be given to an example of the thin film capacitor according to the third embodiment.

The formation of the electrode layers 5, 7, the terminal electrodes 21 and the terminal electrode layers 17 was achieved by a high-frequency magnetron sputtering method, and the formation of the insulating layer (dielectric thin film) was achieved by a sol-gel method.

A 3-nm thick adherent layer of Ti was formed on a carrier substrate 1 of alumina, and a 0.3-$\mu$m thick Au layer was formed on the upper surface of the adherent layer. Then, the adherent layer and the Au layer were patterned by the photolithography technique for formation of a lower electrode layer 5 and a metal layer 16. Subsequently, a Pb(Mg$_{1/3}$Nb$_{2/3}$) O$_3$—PbTiO$_3$—PbZrO$_3$ coating solution prepared by the sol-gel method was applied onto the resulting substrate by a spin-coating method, and dried. The resulting substrate was subjected to a heat treatment at 380° C., and then baked at 815° C. Thus, a 0.7-$\mu$m thick insulating layer 3 of Pb (Mg$_{1/3}$Nb$_{2/3}$) O$_3$—PbTiO$_3$—PbZrO$_3$ was formed. Thereafter, through-holes were formed in the dielectric thin film 3 by the photolithography technique.

Subsequently, a 30-nm thick adherent layer of Ti was formed on the upper surface of the dielectric thin film 3, and a 0.3-$\mu$m thick Au layer was formed on the adherent layer. Then, the adherent layer and the Au layer were patterned by the photolithography technique for formation of an upper electrode layer 7 and a metal layer 15. Thus, the thin film capacitor was fabricated.

Thereafter, a photo-sensitive BCB was applied onto the resulting substrate, and then exposed to light and developed. Thus, a protective layer 9 with through-holes each having a diameter of about 100 $\mu$m and a depth of 1 $\mu$m was formed to expose the Au electrode layer 7 and the Au metal layer 15.

The through-holes 13a, 13b were each filled with terminal electrodes 21 by the evaporation method. Further, a 1.5-$\mu$m thick terminal electrode layer 17 and a 0.1-$\mu$m thick Au adherent layer were successively formed on the protective layer 9, and patterned into a diameter of 120 $\mu$m centering on the through-holes by the photolithography technique so that terminal electrode layers 17 were left on surface portions of the protective layer 9 around the through-holes 13a, 13b.

Finally, a eutectic solder paste consisting essentially of 63 wt % Pb and 37 wt % Sn was transferred onto the patterned terminal electrode layers 17 by a screen printing method, and the resulting substrate was subjected to a reflow process for formation of external terminals 11. Thus, the thin film capacitor was fabricated which had the construction shown in FIG. 7.

The thin film capacitor thus fabricated had an effective electrode area of 1.4 mm$^2$ and a capacitance of about 40 nF at a frequency of 1 kHz.

The thin film capacitor of this example was repeatedly subjected to the reflow process under the reflow conditions employed for the formation of the external terminals, and observed by a high magnification microscope to determine the extent to which the solder of the external terminals was diffused into the Au electrode layers. As a result, the diffusion of the solder did not occur even after the tenth reflow process.

Further, the ball shear strength was measured after the repeated reflow process. As a result, the ball shear strength after the tenth reflow process was reduced only by about 5% as compared with the initial ball shear strength. This indicates that the deterioration in the strength of the external terminals was small.

Moreover, a relationship between the capacitance and the time of the repetition of the reflow process was investigated. As a result, a change in the capacitance was negligible even after the tenth reflow process. This indicates that the diffusion of the solder did not occur and the dielectric thin film was hardly influenced by stresses caused due to heat shrinkage of the external terminals thereby to provide for sufficient insulation.

Figure 8:
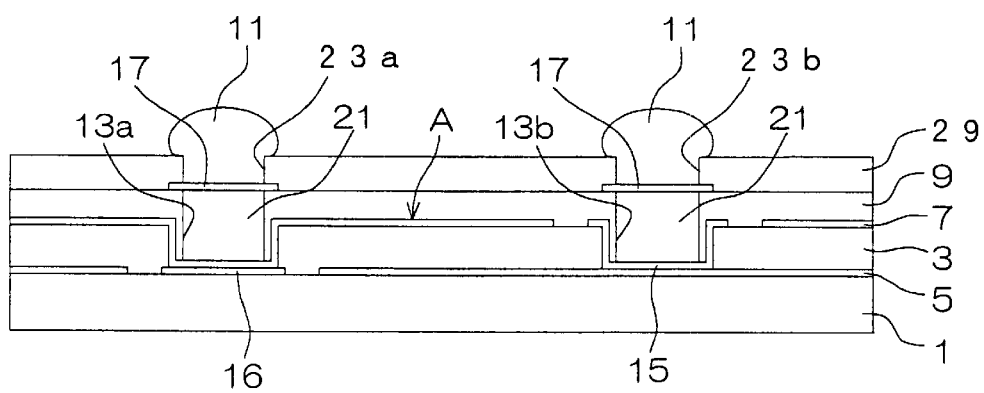
FIG. 8 is a sectional view illustrating the construction of a thin film capacitor according to a fourth embodiment of the invention.

FIG. 8 illustrates a fourth embodiment of the invention. In a thin film electronic device according to the fourth embodiment, a surface protective layer 29 is provided on the surface of a protective layer 9. The surface protective layer 29 is formed with through-holes 23a, 23b which respectively communicate with through-holes 13a, 13b formed in the protective layer 9. Bottom portions of external terminals 11 are fitted in the through-holes 23a, 23b in the surface protective layer 29.

This thin film electronic device provides the same effects as in the third embodiment. Further, the moisture resistance of the passive element can further be improved, because the two protective layers 9, 29 are provided.

Figure 9A:
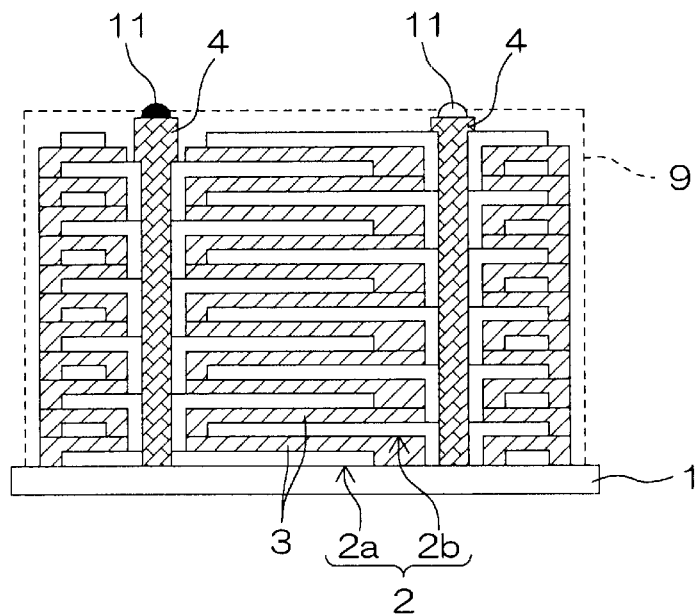
FIG. 9A is a sectional view illustrating the construction of a thin film laminate capacitor according to a fifth embodiment of the invention.
Figure 9B:
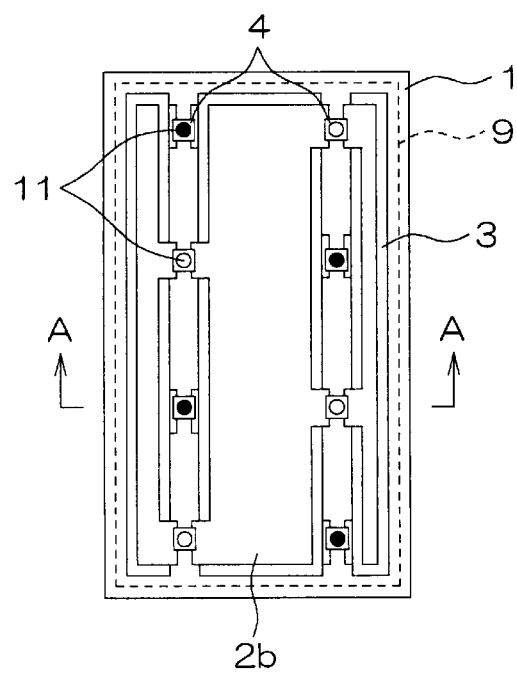
FIG. 9B is a plan view of the thin film laminate capacitor according to the fifth embodiment of the invention.

FIGS. 9A and 9B illustrate sectional constructions of a thin film laminate capacitor according to a fifth embodiment of the invention. Particularly, FIG. 9A is a sectional view taken along a line A—A in FIG. 9B, and FIG. 9B is a plan view of the thin film laminate capacitor.

The thin film laminate capacitor comprises a plurality of electrode layers 2a, 2b and a plurality of dielectric layers 3 alternately stacked on a carrier substrate 1, wherein the electrode layers 2a and 2b of different polarities are isolated from each other by the dielectric layers 3. In FIG. 9A, the dielectric layers 3 are denoted by slant-line patterns for easy understanding. After the uppermost electrode layer 2b is formed, terminal electrode layers 4 are formed for connecting the electrode layers 2a, 2b having the same potential to each other, and a protective film 9 having through-holes to expose surface portions of the terminal electrode layers 4 is provided as covering the entire thin film laminate capacitor.

For easy understanding, the terminal electrode layers 4 are denoted by grid patterns in FIG. 9A, and the protective film 9 is denoted by broken lines in FIGS. 9A and 9B. External terminals 11 for external connection are provided on exposed surface portions of the terminal electrode layers 4. The external terminals 11 are denoted by symbols ○ and ● in FIGS. 9A and 9B. The external terminals 11 denoted by the symbols ○ and ● have different potential.

In the thin film laminate capacitor according to the fifth embodiment, the electrode layers 2a, 2b are formed of a material mainly composed of a metal element having a resistivity of not higher than $3 \times 10^{-8}$ Ωm at 0° C. If the material is mainly composed of a metal element having a resistivity of higher than $3 \times 10^{-8}$ Ωm at 0° C., an equivalent serial resistance which indicates the resistance component of the capacitor element increases, so that the thin film laminate capacitor has a higher impedance.

Examples of the metal element having a resistivity of not higher than $3 \times 10^{-8}$ Ωm at 0° C. include Au, Ag, Cu and Al. The electrode layers 2a, 2b are desirably composed of Au having a resistivity of $2.05 \times 10^{8}$ Ωm, because Au has an excellent oxidation resistance.

Examples of a material for the dielectric layers 3 include compounds represented by $(Ba,Sr)TiO_3$ and $Pb(Zr,Ti)O_3$. These dielectric materials can be deposited at not higher than 400° C. by a sputtering method, and each have a high permittivity, i.e., not lower than 200. Since the temperature for the formation of the dielectric layers 3 is relatively low, a metal mask method can be employed. Without any distortion of a metal mask, a stable patterning resolution can be obtained.

The material for the dielectric layers 3 is not limited to the aforesaid materials, but any of various dielectric materials may be employed as long as they are imparted with a specific permittivity of about 200 at a formation temperature of not higher than 400° C. without any special equipment and any special starting material. The formation of the dielectric layers is desirably achieved by a sputtering method, particularly by a magnetron sputtering method or a three-electrode or four-electrode sputtering method which allows for high speed film formation.

The dielectric layers 3 each have a thickness of not greater than 200 nm. Where the specific permittivity is 230, for example, a capacitance of not lower than 10 nF/mm² per unit area can be obtained. Therefore, a capacitor having a capacitance of 0.33 μF with an electrode area of 3 mm², for example, can be fabricated by stacking 11 (eleven) dielectric layers.

If the dielectric layers 3 each have a thickness of greater than 200 nm, the time required for the formation of the dielectric layer 3 is increased, and the number of the dielectric layers to be stacked should be increased for obtaining a desired capacitance. This deteriorates the productivity. Where the dielectric layers 3 each have a thickness of 300 nm with a specific permittivity of 230 as described above, for example, 17 (seventeen) dielectric layers should be stacked for fabrication of a capacitor having a capacitance of 0.33 μF with an electrode area of 3 mm². With the same yield, an about 2.3-time period is required for the fabrication. The capacitance of each dielectric layer 3 tends to be increased as the thickness thereof is reduced. However, a short circuit (short) is more liable to occur between the electrode layers 2a and 2b as the thickness of the dielectric layer 3 is reduced. Therefore, the thickness is desirably 100 to 200 nm.

The electrode layers 2a, 2b each have a thickness which is not greater than two-thirds of the thickness of the dielectric layer 3. The insulation between the electrode layers 2a and 2b should properly be maintained, and the coverage of the dielectric layers 3 at the steps of the electrode layers 2a, 2b can be improved by setting the thickness of the electrode layer 2a, 2b to two-thirds of the thickness of the dielectric layer 3. As a result, the short circuit between the electrode layers 2a and 2b can be prevented to improve the yield. On the contrary, if the thickness of the electrode layer 2a, 2b is greater than two-thirds of the thickness of the dielectric layer 3, the coverage of the dielectric layers 3 at the steps of the electrode layers 2a, 2b is deteriorated, so that the short circuit between the electrode layers 2a and 2b is more liable to occur.

Examples of a material for the carrier substrate 1 include alumina, glass, sapphire, single crystalline MgO, single crystalline $SrTiO_3$ and $SiO_2$-coated silicon. Particularly, alumina and glass are desirable because they are less expensive and have a smaller reactivity with the thin films and a higher strength.

In the thin film laminate capacitor according to the fifth embodiment, the dielectric layers 3 each have a thickness of not greater than 200 nm, so that the number of the layers to be stacked can be reduced for obtaining a desired capacitance. Therefore, the yield can be improved correspondingly to the reduction in the number of the stacked layers. Further, the electrode layers 2a, 2b formed of the material mainly composed of the metal element having a resistivity of not higher than $3 \times 10^{-8}$ Ωm at 0° C. are stacked, so that the resistance components of the capacitor elements can be made small and hence the impedance of the thin film laminate capacitor can be reduced. Since the electrode layers 2a, 2b each have a thickness which is not greater than two-thirds of the thickness of the dielectric layer, the coverage with the dielectric layers is improved. Thus, the short circuit between the electrode layers can be prevented to improve the yield.

Next, an explanation will be given to an example of the thin film laminate capacitor according to the fifth embodiment.

The formation of the electrode layers 2a, 2b, the terminal electrode layers 4 and the dielectric layers 3 was achieved by a high-frequency magnetron sputtering method. Ar gas was introduced as a sputtering gas into a process chamber, and the pressure was maintained at 6.7 Pa by vacuum evacuation.

A substrate holder and three target holders were provided in the process chamber, so that sputtering with the use of three types of target materials was possible. The substrate holder was adapted to be moved to a position of a target of a material species to be used for film formation and fixed with a distance of 60 mm between the substrate and the target in the sputtering process.

A high-frequency voltage of 13.56 MHz was applied between the substrate holder and the target from an external high-frequency power source. A high density plasma was produced in the vicinity of the target by a magnetron magnetic field generated by a permanent magnet disposed behind the target for the sputtering of the surface of the target.

Independent application of high-frequency voltages to the three targets was possible. The substrate holder had a heating mechanism with a heater to control the temperature of the carrier substrate at a constant level during the sputtering film formation.

Four types of metal masks each having a thickness of 0.15 mm were adapted to be set on the carrier substrate 1 held by the substrate holder on the side of the target, so that a required one of the masks could be set on a surface of the carrier substrate 1 to be formed with a film depending on a film formation pattern. The temperature of the carrier substrate 1 for the sputtering process was set at 400° C.

Figure 10A:
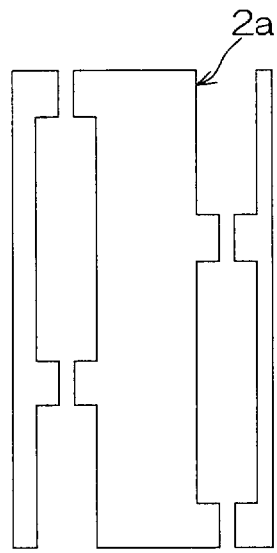
FIG. 10A is a plan view illustrating the configuration of a (2N–1)-th electrode layer (N: a natural number) of the thin film laminate capacitor according to the fifth embodiment.
Figure 10B:
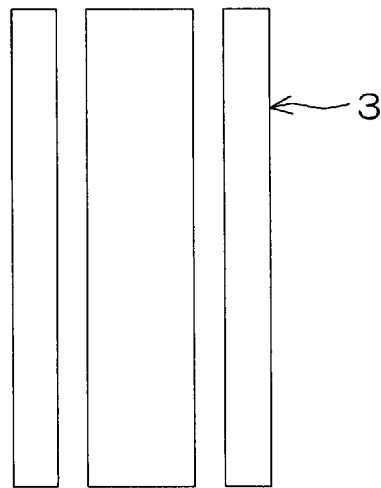
FIG. 10B is a plan view illustrating the configuration of a dielectric layer of the thin film laminate capacitor according to the fifth embodiment.

A mask pattern for formation of a first electrode layer 2a as shown in FIG. 10A was set on a 0.25-mm thick carrier substrate 1 of sintered alumina, and the first electrode layer 2a was formed by sputtering an Au target. Subsequently, a mask pattern for formation of a dielectric layer 3 as shown in FIG. 10B was set on the resulting substrate, and the dielectric layer 3 was formed by sputtering a sintered $(Ba_{0.5}Sr_{0.5})TiO_3$ target. During the formation of the dielectric layer 3, $O_2$ gas was introduced as a sputtering gas into the chamber in a ratio of $Ar:O_2=8:2$.

Figure 10C:
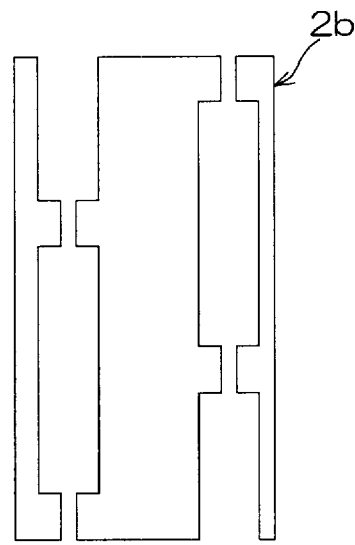
FIG. 10C is a plan view illustrating the configuration of a 2N-th electrode layer (N: a natural number) of the thin film laminate capacitor according to the fifth embodiment.
Figure 10D:
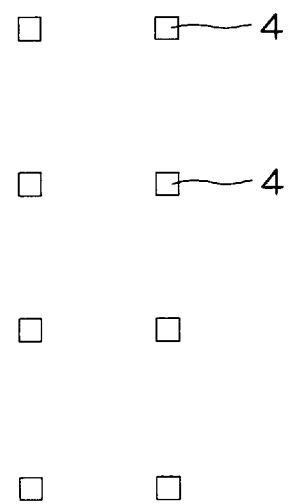
FIG. 10D is a plan view illustrating the arrangement of terminal electrodes of the thin film laminate capacitor according to the fifth embodiment.

Then, a mask pattern for formation of a second electrode layer 2b as shown in FIG. 10C was set on the resulting substrate, and the second electrode layer 2b was formed by sputtering the Au target. Thereafter, dielectric layers 3 and electrode layers 2 were alternately stacked to provide a laminate consisting of 11 (eleven) dielectric layers 3 and 12 (twelve) electrode layers 2a, 2b. (2N−1)-th electrode layers (N: a natural number) were first electrode layers 2a each having the pattern shown in FIG. 10A, while 2N-th electrode layers (N: a natural number) were second electrode layers 2b each having the pattern shown in FIG. 10C. Finally, terminal electrode layers 4 were formed on the resulting substrate with the use of a mask pattern for the terminal electrode layers 4 as shown in FIG. 10D for connection between the first electrode layers 2a and for connection between the second electrode layers 2B.

Thereafter, the resulting substrate was taken out of the process chamber, and a protective film 9 having via-holes to be located on the terminal electrode layers 4 was formed on the resulting substrate with the use of a photosensitive resin. Then, a solder paste was screen-printed in the via-holes, and the resulting substrate was subjected to a reflow process for formation of external terminals 11 each having a diameter of 0.1 mm. In this manner, thin film laminate capacitors were fabricated which had the construction shown in FIG. 9A.

The thin film laminate capacitors thus fabricated were analyzed by the X-ray diffraction analysis. The analysis indicates that the (Ba, Sr)$TiO_3$ dielectric films were perovskite crystalline films having a major peak at the (110) plane with a low peak intensity.

Figure 11:
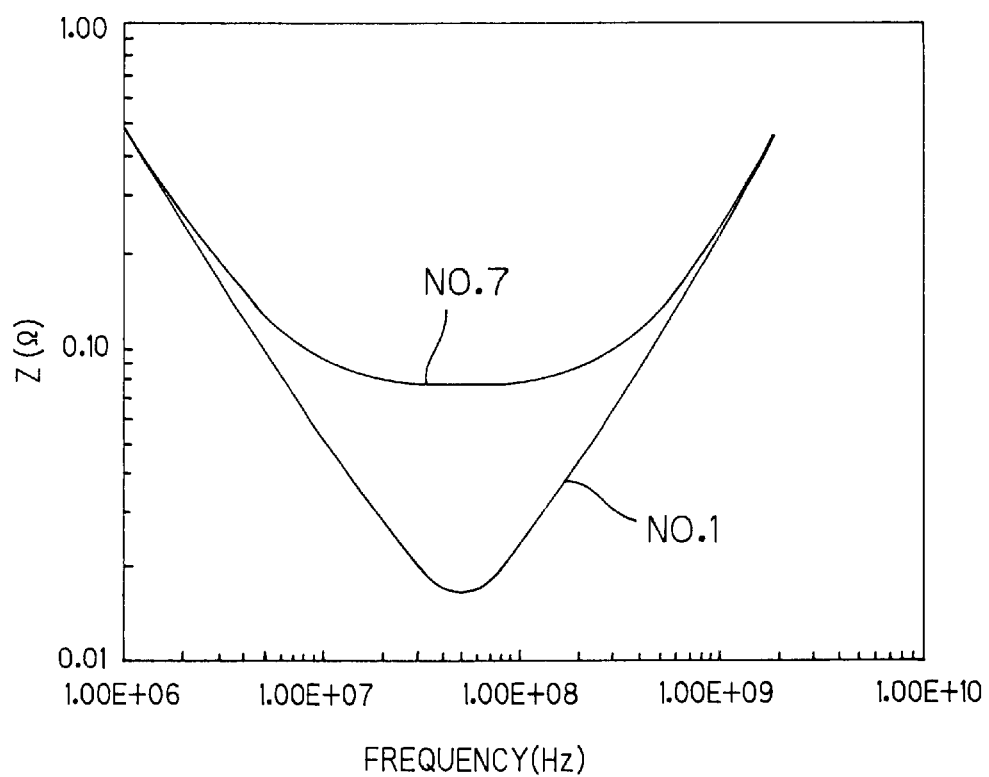
FIG. 11 is a diagram illustrating impedance characteristics of an example according to the invention and a comparative example.

The impedance characteristics (capacitance C, equivalent serial resistance ESR, and inductance L) of the fabricated thin film laminate capacitors were measured in a frequency range between 1 MHz and 1.8 GHz with the use of an impedance analyzer (HP4291A available from Hewlett-Packard Company) and a microwave probe (available from Picoprobe Corporation). The results are shown in FIG. 11. Further, averages of the measured characteristic values and a yield determined as the number of capacitors free from a short circuit between the electrode layers with respect to 1000 capacitors subjected to the measurement are shown in the column of Sample No. 1 in Table 3.

As a result of observation of cross sections of the capacitors by an SEM after the aforesaid evaluation, it was found that the electrode layers each had a thickness of 100 nm and the dielectric layers each had a thickness of 200 nm.

As other examples, thin film laminate capacitors were fabricated in substantially the same manner, except that: a sintered $Pb(Zr_{0.5}Ti_{0.5})O_3$ target was employed as the dielectric target (Sample No. 2); and the thickness of the dielectric layer was reduced to 150 nm and the number of the stacked dielectric layers was reduced to eight (Sample No. 3). The results of the evaluation of these samples are also shown in Table 3.

As comparative examples, thin film laminate capacitors were fabricated in substantially the same manner, except that: the thickness of the dielectric layer was increased to 300 nm (Samples No. 4 and No. 5); the electrode layers each had the same thickness as the dielectric layers (Sample No. 6); the material for the electrode layers was Pt which had a resistivity of $9.8\times10^{-8}$ Ωm at 0° C. (Sample No. 7). The results of the evaluation of these samples are also shown in Table 3.

TABLE 3

| Sample No. | 1 | 2 | 3 | 4 | 5 | 6 | 7 |
|---|---|---|---|---|---|---|---|
| Electrode layers | | | | | | | |
| Material | Au | Au | Au | Au | Au | Au | Pt |
| Thickness (nm) | 100 | 100 | 100 | 200 | 200 | 150 | 100 |
| Dielectric layers | | | | | | | |
| Material | (Ba, Sr) $TiO_3$ | Pb (Zr, Ti) $O_3$ | (Ba, Sr) $TiO_3$ | (Ba, Sr) $TiO_3$ | (Ba, Sr) $TiO_3$ | (Ba, Sr) $TiO_3$ | (Ba, Sr) $TiO_3$ |
| Thickness (nm) | 200 | 200 | 150 | 300 | 300 | 150 | 200 |
| Number of layers | 11 | 11 | 8 | 11 | 17 | 11 | 11 |
| Formation temperature (° C.) | 400 | 400 | 400 | 400 | 400 | 400 | 400 |
| Evaluation of characteristics | | | | | | | |
| Capacitance C (μF) | 0.33 | 0.33 | 0.33 | 0.22 | 0.33 | 0.33 | 0.33 |
| Resistance ESR (mΩ) | 17 | 20 | 25 | 10 | 8 | 12 | 76 |
| Inductance LpH | 35 | 35 | 35 | 35 | 35 | 35 | 35 |

TABLE 3-continued

| Sample No. | 1 | 2 | 3 | 4 | 5 | 6 | 7 |
|---|---|---|---|---|---|---|---|
| Judgment of characteristics Evaluation of yield | ○ | ○ | ○ | X | ○ | ○ | X |
| Yield/1000 | 522 | 531 | 647 | 510 | 324 | 102 | 669 |
| Judgment of yield | ○ | ○ | ○ | ○[1] | X[2] | X | ○ |

Note [1]: The time required for the fabrication was 1.5 times that of Sample No. 1.
Note [2]: The time required for the fabrication was 2.3 times that of Sample No. 1.

As can be understood from Table 3, Samples No. 1 to No. 3 according to the fifth embodiment each had desired characteristics, i.e., an average capacitance of 0.33 μF and an average equivalent serial resistance ESR of not higher than 30 mΩ, and the yields thereof were not lower than 50%. The yield of Sample No. 3 was increased correspondingly to the reduction in the number of the stacked layers. Therefore, the thin film laminate capacitors according to the fifth embodiment satisfied the requirements for characteristics of a low impedance capacitor, i.e., a capacitance of not lower than 0.3 μF, an equivalent serial resistance of not higher than 30 mΩ and an impedance of not higher than 40 pH.

On the contrary, where the thickness of the dielectric layer was increased to 300 nm (Samples No. 4 and No. 5), the desired capacitance was not obtained with the number of the stacked layers being 11 (Sample No. 4), and the yield was reduced and the time required for the fabrication of the capacitor was increased with the number of the stacked layers being increased to 17 for obtaining the desired capacitance (Sample No. 5), resulting in a reduced productivity.

Where the thickness of the electrode layer was the same as the thickness of the dielectric layer (Sample No. 6), the fabricated thin film laminate capacitor had excellent characteristics. However, short circuits between the electrode layers frequently occurred, and the yield was reduced to about 10%, resulting in a reduced productivity.

Where Pt having a higher resistivity was employed as the material for the electrode layers (Sample No. 7), the desired characteristics were not obtained with an equivalent serial resistance of not lower than 30 mΩ. The impedance characteristic is shown in FIG. 11.

Figure 12A:
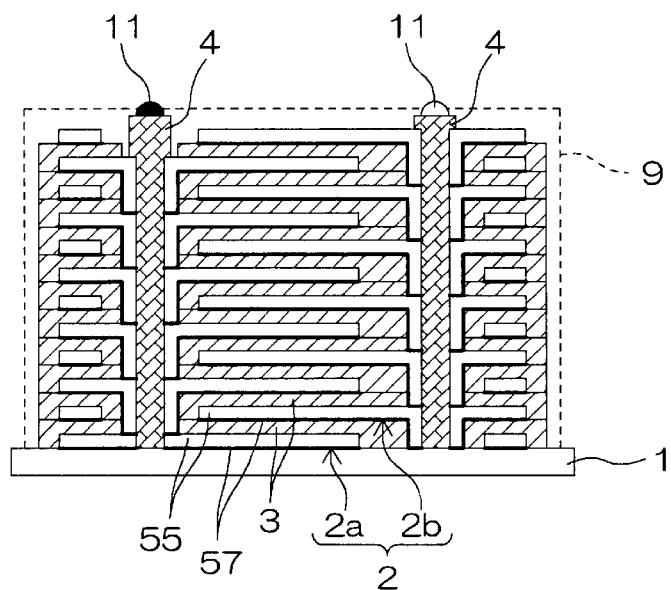
FIG. 12A is a sectional view illustrating the construction of a thin film laminate capacitor according to a sixth embodiment of the invention.
Figure 12B:
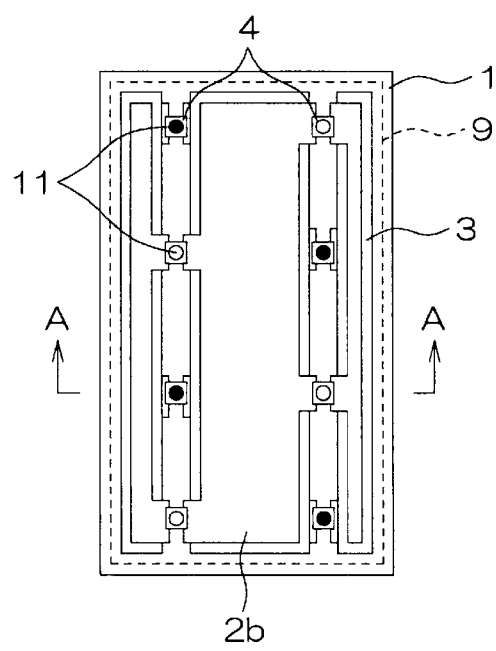
FIG. 12B is a plan view of the thin film laminate capacitor according to the sixth embodiment of the invention.

FIGS. 12A and 12B illustrate a thin film laminate capacitor according to a sixth embodiment of the invention. Particularly, FIG. 12A is a sectional view taken along a line A—A in FIG. 12B, and FIG. 12B is a plan view. The thin film laminate capacitor shown in FIGS. 12A and 12B comprises a plurality of electrode layers 2a, 2b and a plurality of dielectric layers 3 alternately stacked on a carrier substrate 1, wherein the electrode layers 2a and 2b of different potentials are isolated from each other by the dielectric layers 3.

The electrode layers 2a, 2b each comprise a low-resistance layer 55 formed of a material mainly composed of Au, and a Ti containing layer 57 provided on the lower surface of the low-resistance layer 55. Although it is desirable to provide Ti containing layers 57 on all the surfaces (upper and lower surfaces) of the electrode layers 2a, 2b in contact with the dielectric layers 3, the adhesion between the electrode layers 2a, 2b and the dielectric layers 3 can be improved by providing the Ti containing layers 57 on at least the surfaces (lower surfaces) of the electrode layers 2a, 2b on the side of the substrate.

Although the low-resistance layers 55 are formed of the material mainly composed of Au for reduction in the resistance and the reactivity with the dielectric layers 3, the material for the low-resistance layers 55 is not particularly limited as long as the material does not deteriorate the advantage of the low resistance of Au. Particularly, the material for the low-resistance layers is desirably composed of Au alone for reduction in the resistance of the electrode layers 2a, 2b.

The Ti containing layers 57 are essentially metal Ti layers, but an oxide maybe formed in interface portions thereof in contact with the dielectric layers 3. The material for the Ti containing layers may contain an additional element as long as the element does not deteriorate the adhesion between the low-resistance layers 55 and the dielectric layers 3, but desirably composed of Ti alone.

The Ti containing layers 57 desirably each have a thickness of 1 to 30 nm. If the thickness of the Ti containing layer is smaller than 1 nm, the adhesion is liable to be reduced. If the thickness is greater than 30 nm, the resistance tends to be increased. It is particularly desirable that the thickness of the Ti containing layer is 1 to 10 nm.

The formation of the electrode layers 2a, 2b is desirably achieved by a sputtering method, particularly by a magnetron sputtering method or a three-electrode or four-electrode sputtering method which allows for high speed film formation.

The electrode layers 2a, 2b each desirably have a thickness which is not greater than two-thirds of the thickness of the dielectric layer 3. The coverage of the dielectric layers 3 at the steps of the electrode layers 2a, 2b can be improved by reducing the thickness of the electrode layer 2a, 2b, so that a short circuit between the electrode layers 2a and 2b can be prevented to improve the yield.

The dielectric layers 3 to be employed in the sixth embodiment may be formed of a dielectric-material which is imparted with a relative permittivity of about 200 at a formation temperature of not higher than 400° C. without any special equipment and any special starting material and contains a composite oxide represented by a general formula $MTiO_3$ (wherein M is at least one element selected from Ba, Sr, Ca and Pb). Examples of the composite oxide include $BaTiO_3$, $(Ba,Sr)TiO_3$ and $PbTiO_3$. The formation of the dielectric layers is desirably achieved by a sputtering method, particularly by a magnetron sputtering method or a three-electrode or four-electrode sputtering method which allows for high speed film formation.

A reason why the material mainly composed of the composite oxide represented by the general formula $MTiO_3$ (wherein M is at least one element selected from Ba, Sr, Ca and Pb) is employed is that a relative permittivity of not smaller than 200 is expected to be obtained through the sputtering method at not higher than 400° C.

The dielectric layers 3 each desirably have a thickness of not greater than 200 nm. This is because the capacitance component can be increased by stacking the dielectric layers each having a thickness of not greater than 200 nm.

The formation of the electrode layers 2a, 2b and the dielectric layers 3 is desirably achieved at not higher than 400° C. By obviating a high temperature heat treatment in the fabrication, delamination and development of cracks in the dielectric layers 3 can be suppressed. Since the formation of the electrode layers 2a, 2b and the dielectric layers 3 is achieved at a relatively low temperature, a sputtering method with the use of a metal mask can be employed. Therefore, direct patterning is possible to improve the yield. Thus, the production costs can be reduced.

Terminal electrode layers 4 are provided for connecting the electrode layers 2a or 2b having the same potential to each other, and a protective film 9 having through-holes to expose surface portions of the terminal electrode layers 4 is provided as covering the entire thin film laminate capacitor.

External terminals 11 for external connection are provided on exposed surface portions of the terminal electrode layers 4. For easy understanding, the dielectric layers 3, the Ti containing layers 57 and the terminal electrode layers 4 are denoted by slant-line patterns, bold lines and grid patterns, respectively, in FIG. 12A. The protective film 9 is denoted by broken lines in FIGS. 12A and 12B. The external terminals 11 are denoted by symbols ○ and ●. The external terminals 11 denoted by the symbols ○ and ● have different potentials.

The carrier substrate 1 desirably has a thickness of not greater than 0.25 mm. This makes it possible to reduce the thickness of the entire thin film laminate capacitor, so that the capacitor can be mounted in an electronic system of an increasingly reduced size.

Examples of a desirable material for the carrier substrate 1 to be employed in the sixth embodiment include alumina, glass, sapphire, single crystalline MgO, single crystalline $SrTiO_3$ and $SiO_2$-coated silicon. Particularly, alumina and glass are desirable because they are less expensive and have a smaller reactivity with the thin films and a higher strength.

In the thin film laminate capacitor having the aforesaid construction, the electrode layers 2a, 2b each comprise the low-resistance layer 55 composed mainly of Au and the Ti containing layer 57 provided on the lower surface of the low-resistance layer 55, and the Ti containing layers 57 are interposed between the low-resistance layers 55 and the dielectric layers 3. Therefore, the adhesion between the electrode layers 2a, 2b and the dielectric layers 3 can be improved, thereby preventing delamination.

Since the dielectric layers 3 each have a thickness of not greater than 200 nm, the capacitance per unit area can be increased even with a relatively low relative permittivity. This improves the productivity. Where the specific permittivity is 230, for example, a capacitance of not lower than 10 $nF/mm^2$ per unit area can be obtained. Therefore, a capacitor having a capacitance of 0.33 $\mu F$ with an electrode area of 3 $mm^2$, for example, can be fabricated by stacking 11 dielectric layers.

If the thickness of the dielectric layer 3 is greater than 200 nm, the time required for the formation of the dielectric layer 3 is increased, and the number of the dielectric layers to be stacked should be increased. This deteriorates the productivity. Where the dielectric layers 3 each have a thickness of 300 nm with a specific permittivity of 230 as described above, for example, 17 dielectric layers should be stacked for fabrication of a capacitor having a capacitance of 0.33 $\mu F$ with an electrode area of 3 $mm^2$. With the same yield, an about 2.3-time period is required for the fabrication in consideration of an increase in the time required for the film formation and an increase in the number of the layers to be stacked. Since the relatively low relative permittivity can be obtained through the film formation at a relatively low temperature, development of cracks in the dielectric layers 3 can be suppressed which may otherwise occur due to a heat treatment in the fabrication process.

Figure 13A:
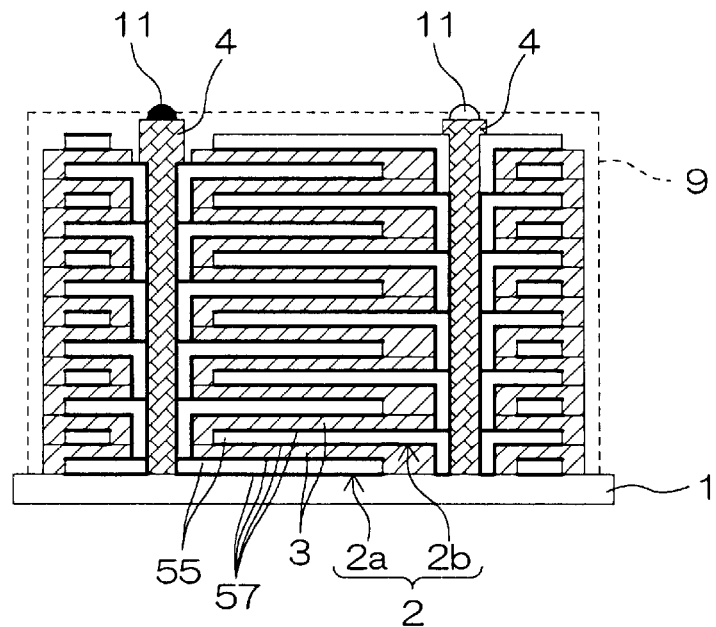
FIG. 13A is a sectional view illustrating the construction of another thin film laminate capacitor according to the sixth embodiment of the invention.
Figure 13B:
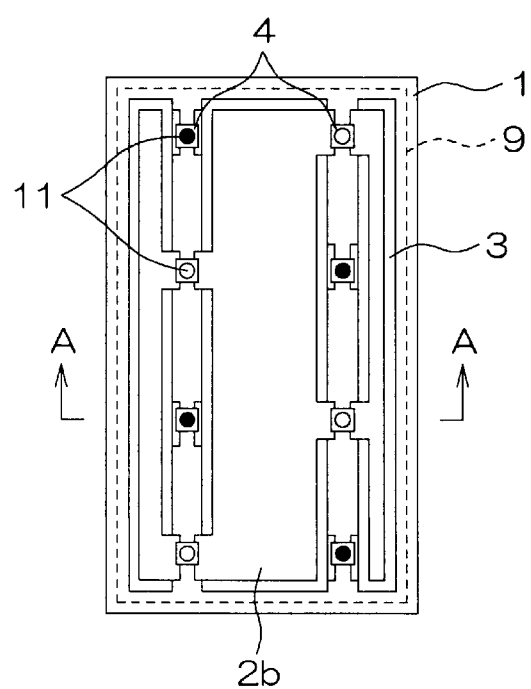
FIG. 13B is a plan view of the another thin film laminate capacitor according to the sixth embodiment of the invention.

FIGS. 13A and 13B illustrate another thin film laminate capacitor according to the sixth embodiment of the invention. Particularly, FIG. 13A is a sectional view taken along a line A—A in FIG. 13B, and FIG. 13B is a plan view. In the thin film laminate capacitor shown in FIGS. 13A and 13B, electrode layers 2a, 2b each comprise a low-resistance layer 55 formed of a material mainly composed of Au, and Ti containing layers 57 provided on upper and lower surfaces of the low-resistance layer 55. In the thin film laminate capacitor, the adhesion between the electrode layers 2a, 2b and the dielectric layers 3 can further be improved.

Next, an explanation will be given to an example of the thin film laminate capacitor according to the sixth embodiment shown in FIG. 13A.

The formation of the electrode layers 2a, 2b, the dielectric layers 3 and the terminal electrode layers 4 was achieved by a high-frequency magnetron sputtering method. Ar gas was introduced as a sputtering gas into a process chamber, and the pressure was maintained at 6.7 Pa by vacuum evacuation.

A substrate holder and three target holders were provided in the process chamber, so that sputtering with the use of three types of target materials was possible. An Au target, a Ti target and a sintered $(Ba_{0.5}Sr_{0.5})TiO_3$ target were provided as the three targets. The substrate holder was adapted to be moved to a position of a target of a material species to be used for the film formation and fixed with a distance of 60 mm between the substrate and the target in the sputtering process.

A high-frequency voltage of 13.56 MHz was applied between the substrate holder and the target from an external high-frequency power source. A high density plasma was produced in the vicinity of the target by a magnetron magnetic field generated by a permanent magnet disposed behind the target for the sputtering of the surface of the target.

Independent application of high-frequency voltages to the three targets was possible. The substrate holder had a heating mechanism with a heater to control the temperature of the carrier substrate at a constant level during the sputtering film formation.

Four types of metal masks each having a thickness of 0.15 mm were adapted to be set on the carrier substrate 1 held by the substrate holder on the side of the target, so that a required one of the masks could be set on a surface of the carrier surface 1 to be formed with a film depending on a film formation pattern. The temperature of the carrier substrate 1 for the sputtering process was set at 400° C.

Figure 14A:
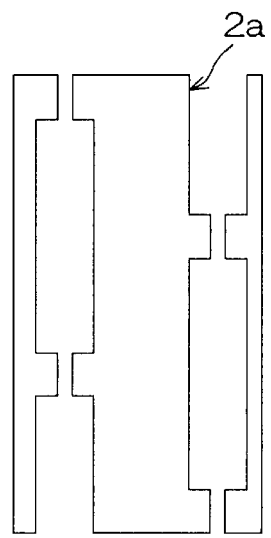
FIG. 14A is a plan view illustrating the configuration of a (2N–1)-th electrode layer (N: a natural number) of the thin film laminate capacitor according to the sixth embodiment.

A mask pattern for formation of a Ti containing layer as shown in FIG. 14A was set on a 0.25-mm thick carrier substrate 1 of sintered alumina, and the Ti containing layer was formed by sputtering the Ti target. Subsequently, a low-resistance layer was formed on the upper surface of the Ti containing layer by sputtering the Au target with the use of the same mask pattern. Thus, an electrode layer 2a was formed.

Figure 14B:
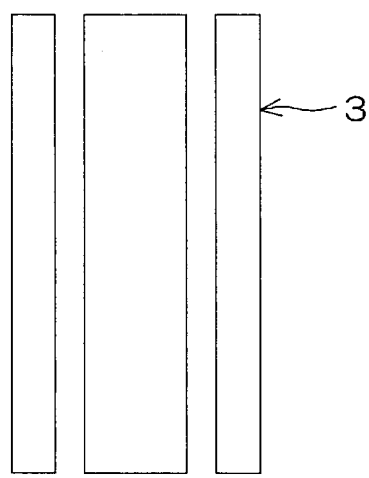
FIG. 14B is a plan view illustrating the configuration of a dielectric layer of the thin film laminate capacitor according to the sixth embodiment.

Then, a mask pattern for formation of a dielectric layer 3 as shown in FIG. 14B was set on the resulting substrate, and the dielectric layer 3 was formed by sputtering the sintered $(Ba_{0.5}Sr_{0.5})TiO_3$ target. During the formation of the dielectric layer 3, $O_2$ gas was introduced as a sputtering gas into the chamber in a ratio of $Ar:O_2=8:2$.

Figure 14C:
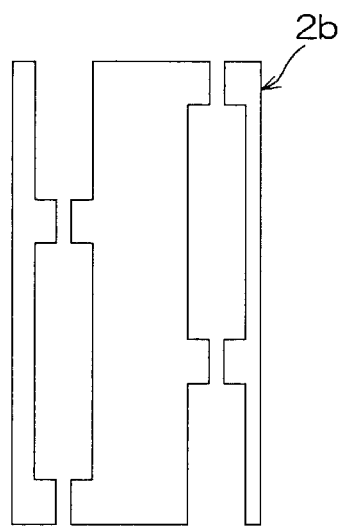
FIG. 14C is a plan view illustrating the configuration of a 2N-th electrode layer (N: a natural number) of the thin film laminate capacitor according to the sixth embodiment.

Subsequently, a mask pattern for formation of a Ti containing layer as shown in FIG. 14C was set on the resulting substrate, and the Ti containing layer was formed by sputtering the Ti target. Then, a low-resistance layer was formed on the upper surface of the Ti containing layer by sputtering the Au target with the use of the same mask pattern. Thus, an electrode layer 2b was formed.

Dielectric layers 3 and electrode layers 2a, 2b were alternately stacked in this manner to provide a laminate consisting of 11 dielectric layers 3 and 12 electrode layers 2a, 2b. (2N–1)-th electrode layers 2a (N: a natural number) each have the pattern shown in FIG. 14A, while 2N-th electrode layers 2b (N: a natural number) each have the pattern shown in FIG. 14C.

Figure 14D:
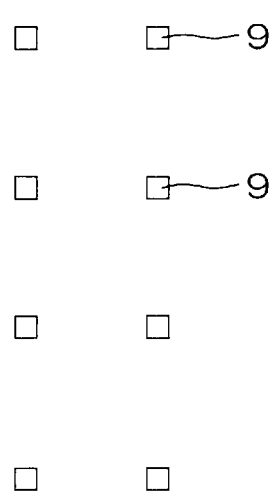
FIG. 14D is a plan view illustrating the arrangement of terminal electrodes of the thin film laminate capacitor according to the sixth embodiment.

Then, the resulting substrate was taken out of the process chamber, and terminal electrode layers 4 as shown in FIG. 14D were formed on the resulting substrate by means of a vapor deposition machine for connection between the (2N–1)-th electrode layers 2a and for connection between the 2N-th electrode layers 2b.

Thereafter, a protective film 9 having through-holes was formed on the terminal electrode layers 4 with the use of a photosensitive resin. Then, a solder paste was screen-printed in the through-holes, and the resulting substrate was subjected to a reflow process for formation of external terminals 11 each having a diameter of 0.1 mm. Finally, the resulting substrate was diced into a desired size. Thus, thin film laminate capacitors were fabricated which had the construction shown in FIG. 13A.

The initial characteristics (capacitance C, equivalent serial resistance ESR and loss) of the thin film laminate capacitors thus fabricated were measured in a frequency range between 1 MHz and 1.8 GHz with the use of an impedance analyzer (HP4291A available from Hewlett-Packard Company) and a microwave probe (available from Picoprobe Corporation).

Averages of the measured characteristic values and a yield determined as the number of capacitors free from a short circuit between the electrode layers with respect to 1000 capacitors subjected to the measurement are shown in the column of Sample No. 1 in Table 4. As a result of observation of cross sections of the capacitors by means of a scanning electron microscope (SEM) after the evaluation, it was found that the thickness of the electrode layer was 100 nm (the thickness of the low-resistance layer was 90 nm and the thickness of the Ti containing layer was 10 nm), and the thickness of the dielectric layer was 200 nm.

As other examples, thin film laminate capacitors were fabricated and evaluated in substantially the same manner, except that: Ti containing layers were formed on the opposite surfaces of the low-resistance layers (Sample No. 2); a sintered $Pb(Zr_{0.5}Ti_{0.5})O_3$ target was employed as the dielectric target, the film formation temperature was 300° C., and the number of the dielectric layers was 12 (Sample No. 3); and the thickness of the dielectric layer was reduced to 150 nm and the number of the dielectric layers was 8 (Sample No. 4). The results of the evaluation of these samples are also shown in Table 4.

As comparative examples, thin film laminate capacitors were fabricated and evaluated in substantially the same manner, except that: no Ti containing layer was formed (Sample No. 5); the low-resistance layers were formed of Pt (Sample No. 6); and the low-resistance layers were formed of Ti (Sample No. 7). The results of the evaluation of these samples are also shown in Table 4.

TABLE 4

| Sample No. | 1 | 2 | 3 | 4 | 5 | 6 | 7 |
|---|---|---|---|---|---|---|---|
| Electrode layers | | | | | | | |
| Lower-resistance layers | Au | Au | Au | Au | Au | Pt | Ti |
| Ti containing layers  Lower surface | Present | Present | Present | Present | Absent | Present | — |
| Upper surface | Absent | Present | Absent | Absent | Absent | Absent | — |
| Thickness (nm) | 100 | 100 | 100 | 100 | 100 | 100 | 100 |
| Dielectric layers | | | | | | | |
| Material | (Ba, Sr) $TiO_3$ | (Ba, Sr) $TiO_3$ | Pb (Zr, Ti) $O_3$ | (Ba, Sr) $TiO_3$ | (Ba, Sr) $TiO_3$ | (Ba, Sr) $TiO_3$ | (Ba, Sr) $TiO_3$ |
| Thickness (nm) | 200 | 200 | 200 | 150 | 200 | 200 | 200 |
| Number of dielectric layers | 11 | 11 | 12 | 8 | 11 | 11 | 11 |
| Formation temperature (° C.) | 400 | 400 | 300 | 400 | 400 | 400 | 400 |
| Capacitance C ($\mu$F) | 0.33 | 0.33 | 0.33 | 0.32 | 0.33 | 0.33 | 0.33 |
| Resistance ESR (m$\Omega$) | 17 | 20 | 15 | 26 | 17 | 76 | 350 |
| Loss (%) | 1 | 1 | 1 | 1 | 3 | 2 | 2 |
| Yield | 878/1000 | 990/1000 | 860/1000 | 922/1000 | 522/1000 | 669/1000 | 985/1000 |

As can be understood from Table 4, the capacitors of Sample No. 1 were obtained at a yield of about 90%, and had a greater capacitance (0.33 $\mu$F) and a lower resistance (ESR 17 m$\Omega$) at the initial stage.

Where the Ti containing layers were formed on the opposite surfaces of the low-resistance layers (Sample No. 2), the yield was improved to about 99%. Where the different dielectric material was employed (Sample No. 3), capacitors each having a greater capacitance and a lower resistance were obtained at a high yield. Where the thickness of the dielectric layer was reduced and the thickness ratio of the electrode layer to the dielectric layer was 2/3 (Sample No. 4), the yield was improved because the number of the dielectric layers required for obtaining the desired capacitance can be reduced. However, the equivalent serial resistance ESR was slightly increased.

On the contrary, the thin film laminate capacitors of the comparative example (Sample No. 5) wherein no Ti containing layer was formed exhibited excellent characteristics, but the loss was slightly increased as compared with the thin film laminate capacitors according to the present invention. Occurrence of delamination reduced the yield, resulting in a reduced productivity.

Where the low-resistance layers were not formed of Au but formed of Pt or Ti (Samples No. 6 and No. 7), the desired characteristics were not obtained with a higher equivalent serial resistance ESR.

While the present invention has thus been described in detail by way of the specific embodiments thereof, it should be understood that the invention be not limited to the embodiments, but various modifications maybe made within the scope of the invention defined by the following claims.

What is claimed is:

1. A thin film electronic device comprising:

a carrier substrate;

a laminate provided on the carrier substrate, and comprising a laminate structure having an insulating layer and a plurality of electrode layers, and wherein the insulating layer defines two or more gaps;

a thin film element formed in the laminate with the insulating layer held between the electrode layers; and a plurality of terminal electrodes electrically connected to the corresponding electrode layers and respectively provided in the gaps for receiving electrical signals of different potentials applied thereto wherein the laminate is covered with a protective layer, wherein the protective layer has through-holes formed therein in the gaps, and the terminal electrodes are exposed in the through-holes, wherein the through-holes each have a diameter which gradually increases toward a surface of the protective layer apart from the electrode layers, wherein the through-holes each have an interior surface which is linearly inclined at an angle of 15 to 60 degrees with respect to the electrode layers located below the protective layer.

2. A thin film electronic device as set forth in claim 1, wherein the terminal electrodes are each provided with an external terminal.

3. A thin film electronic device comprising: as set forth in claim 1, wherein the through-holes in the protective layer are spaced by a predetermined distance from the insulating layer as viewed from top of the carrier substrate.

4. A thin film electronic device as set forth in claim 3, wherein the distance between the insulating layer and the through-holes in the protective layer is not smaller than 5 μm.

5. A thin film electronic device as set forth in claim 1, wherein the electrode layers include a lower electrode layer and an upper electrode layer, and the thin film element includes a passive element constituted by the lower electrode layer, the upper electrode layer, and the insulating layer held between the lower electrode layer and the upper electrode layer.

6. A circuit board comprising:

a base; and a thin film electronic device as recited in claim 1, the thin film electronic device being mounted on a surface of the base and electrically connected to the base via the external terminals provided on the terminal electrodes.

7. A thin film electronic device as set forth in claims 1, wherein the terminal electrodes cover bottom faces and interior surfaces of the respective through-holes and surface portions of the protective layer around the respective through-holes.

8. A thin film electronic device as set forth in claim 1, wherein a terminal electrode metal is filled in the through-holes to serve as the terminal electrodes.

9. A thin film electronic device as set forth in claim 8, wherein the terminal electrodes cover surface portions of the protective layer around the respective through-holes.

10. A thin film electronic device as set forth in claim 1, wherein one of the electrode layers is provided on the carrier substrate and comprises:

a metal oxide layer provided on the substrate;

a metal layer provided on the metal oxide layer and composed of the same metal as contained in the metal oxide layer; and an Au layer provided on the metal layer.

11. A thin film electronic device as set forth in claim 1, wherein the insulating layer includes a plurality of dielectric layers, and the thin film element is constituted by the plurality of dielectric layers and the plurality of electrode layers which are alternately stacked.

12. A thin film electronic device as set forth in claim 11, which includes a thin film laminate capacitor, wherein the dielectric layers are mainly composed of a composite oxide represented by a general formula $MTiO_3$ (wherein M is at least one element selected from the group consisting of Ba, Sr, Ca and Pb), and the electrode layers each comprise a low-resistance layer mainly composed of Au and a Ti containing layer provided on at least one of upper and lower surfaces of the low-resistance layer.

13. A thin film electronic device which includes a thin film laminate capacitor comprising:

a carrier substrate;

a laminate provided on the carrier substrate, and comprising a laminate structure having an insulating layer and a plurality of electrode layers, and wherein the insulating layer defines two or more gaps;

a thin film element formed in the laminate with the insulating layer held between the electrode layers; and a plurality of terminal electrodes electrically connected to the corresponding electrode layers and respectively provided in the gaps for receiving electrical signals of different potentials applied thereto wherein the insulating layer includes a plurality of dielectric layers, and the thin film element is constituted by the plurality of dielectric layers and the plurality of electrode layers which are alternately stacked wherein the dielectric layers each have a thickness of not greater than 200 nm, wherein the electrode layers each have a thickness which is not greater than two-thirds of the thickness of the dielectric layer, wherein the electrode layers are mainly composed of a metal element having a resistivity of not greater than $3 \times 10^{-8} \Omega m$ at 0° C.

* * * * *